(12) United States Patent
Fischer et al.

(10) Patent No.: US 9,318,358 B2
(45) Date of Patent: Apr. 19, 2016

(54) ETCHING DEVICE AND A METHOD FOR ETCHING A MATERIAL OF A WORKPIECE

(75) Inventors: Thomas Fischer, Regensburg (DE); Raimund Foerg, Straubing (DE); Sebastian Bernrieder, Regensburg (DE); Michael Larisch, Regensburg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 588 days.

(21) Appl. No.: 13/095,956

(22) Filed: Apr. 28, 2011

(65) Prior Publication Data
US 2012/0273462 A1    Nov. 1, 2012

(51) Int. Cl.
| | | |
|---|---|---|
| C23F 1/00 | (2006.01) |
| H01L 21/00 | (2006.01) |
| H01L 31/18 | (2006.01) |
| C23F 1/08 | (2006.01) |
| H01L 21/67 | (2006.01) |

(52) U.S. Cl.
CPC ...... *H01L 21/67086* (2013.01); *H01L 21/6704* (2013.01); *H01L 21/67017* (2013.01); *H01L 21/67057* (2013.01); *H01L 21/67075* (2013.01)

(58) Field of Classification Search
USPC ............. 156/345.23, 345.11, 345.31, 345.51, 156/345.54, 345.55; 134/902
See application file for complete search history.

(56) References Cited

U.S. PATENT DOCUMENTS

| | | | |
|---|---|---|---|
| 5,806,544 A * | 9/1998 | Kosic ............................. 134/68 |
| 2005/0178409 A1 | 8/2005 | Masaki et al. |
| 2009/0020226 A1 * | 1/2009 | Nam et al. ............... 156/345.19 |
| 2009/0227114 A1 * | 9/2009 | Ramirez et al. ............... 438/745 |
| 2012/0273462 A1 * | 11/2012 | Fischer et al. .................. 216/58 |

FOREIGN PATENT DOCUMENTS

| | | |
|---|---|---|
| CN | 101056718 A | 10/2007 |
| JP | S57-110674 A | 7/1982 |
| JP | H04243117 A | 8/1992 |
| WO | 2006055766 A1 | 5/2006 |

\* cited by examiner

*Primary Examiner* — Sylvia R MacArthur

(57) ABSTRACT

An etching device is provided, the etching device including a process chamber including an etchant, a structure configured to provide a laminar flow of the etchant, and a workpiece handler configured to move a workpiece through the laminar flow of the etchant along a predefined track.

21 Claims, 23 Drawing Sheets

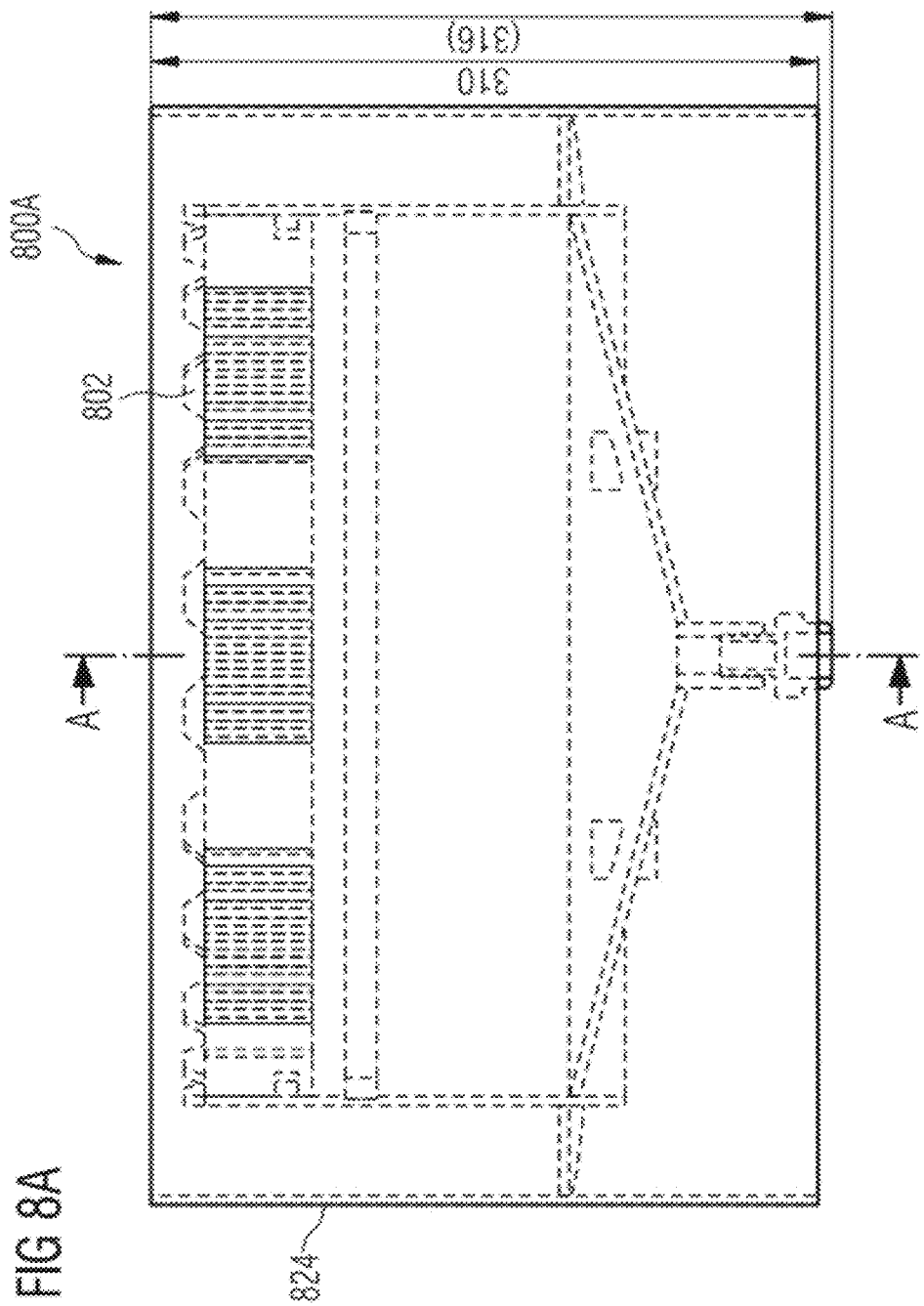

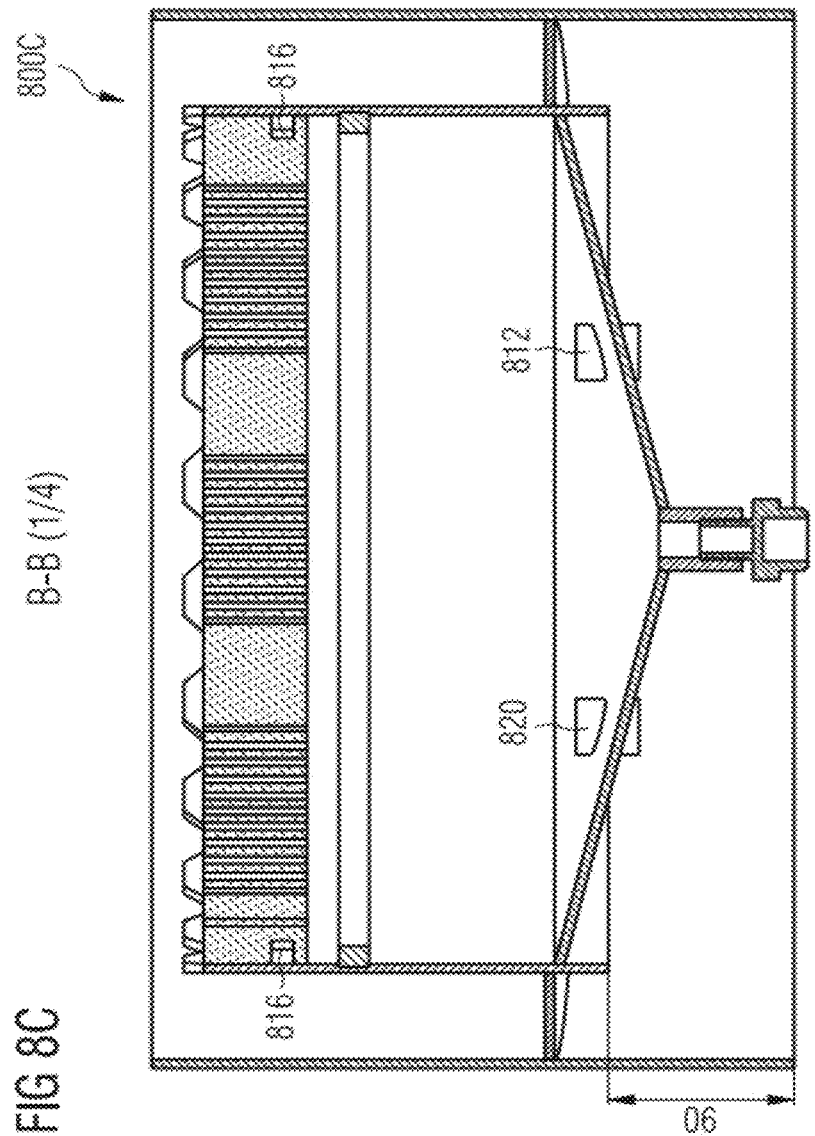

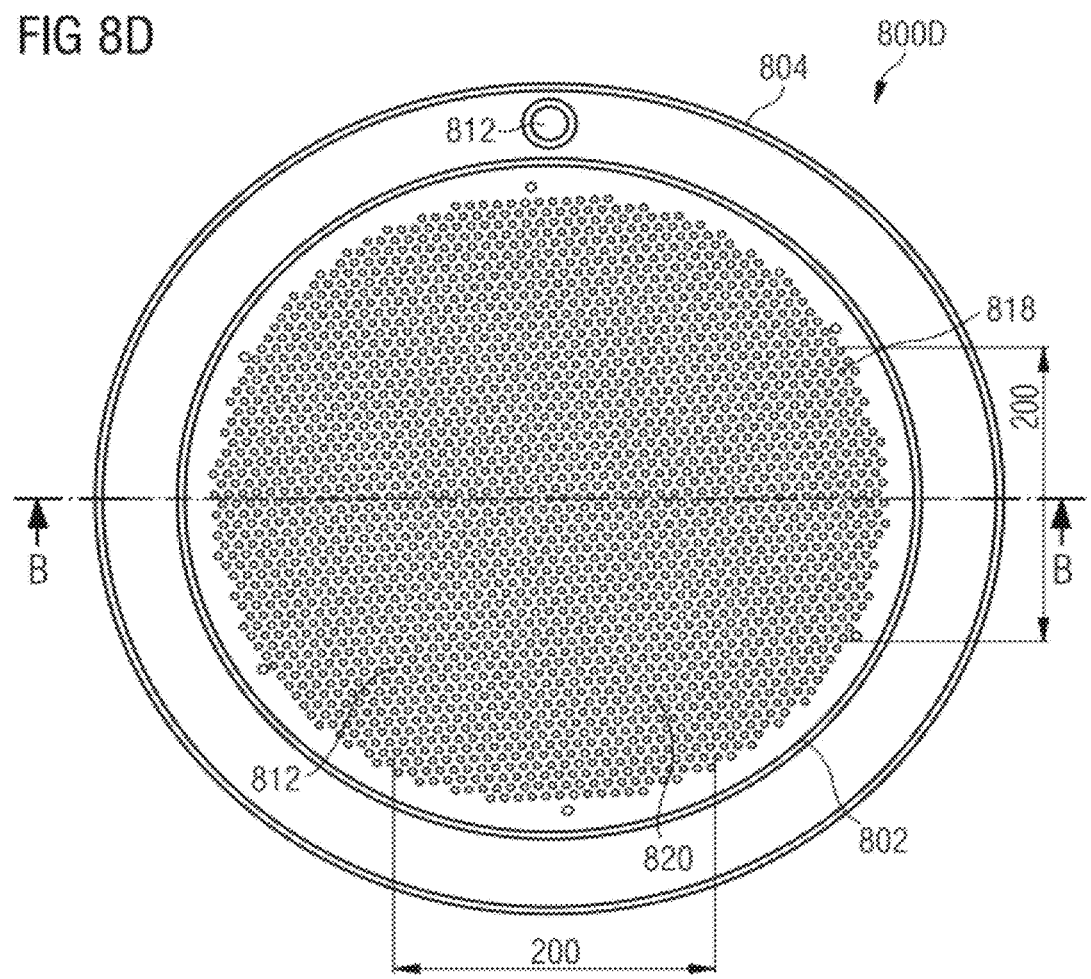

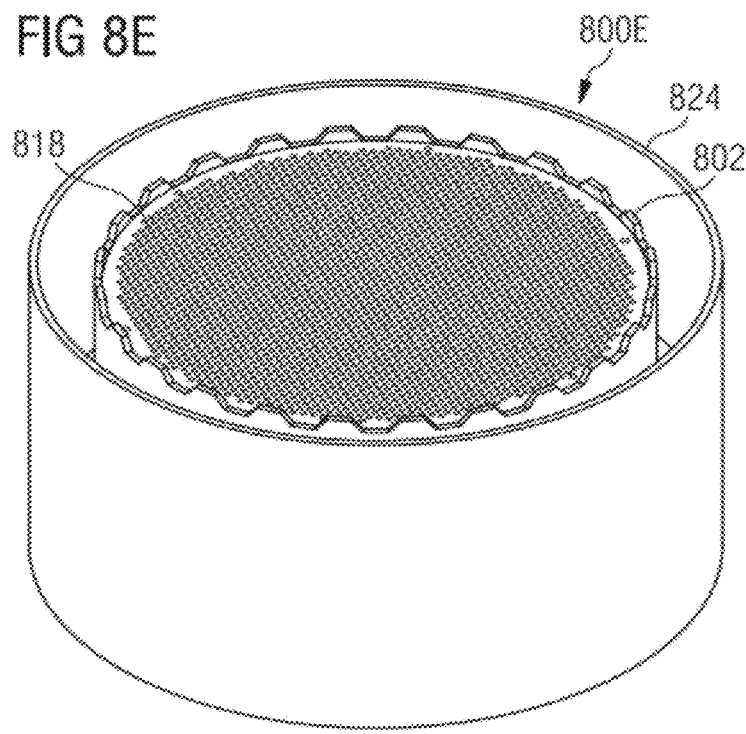
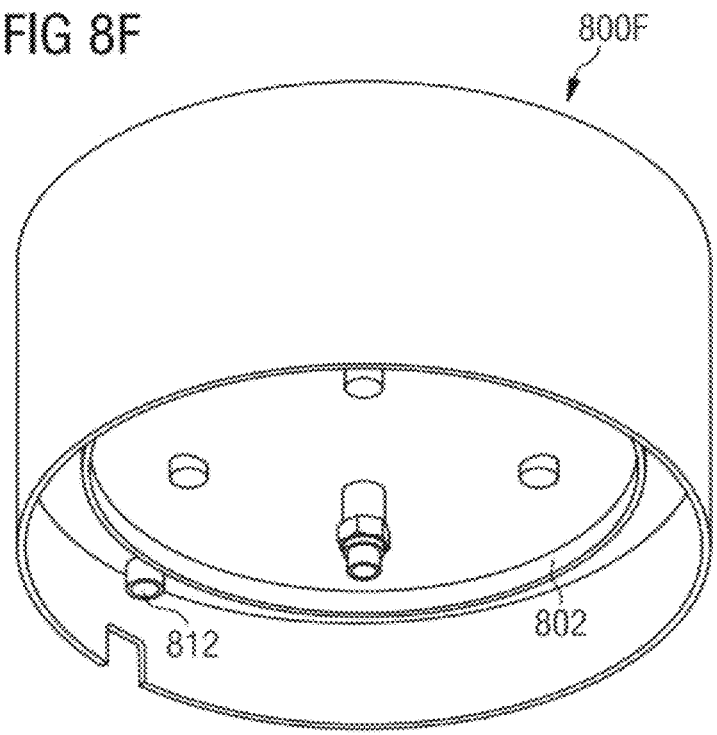

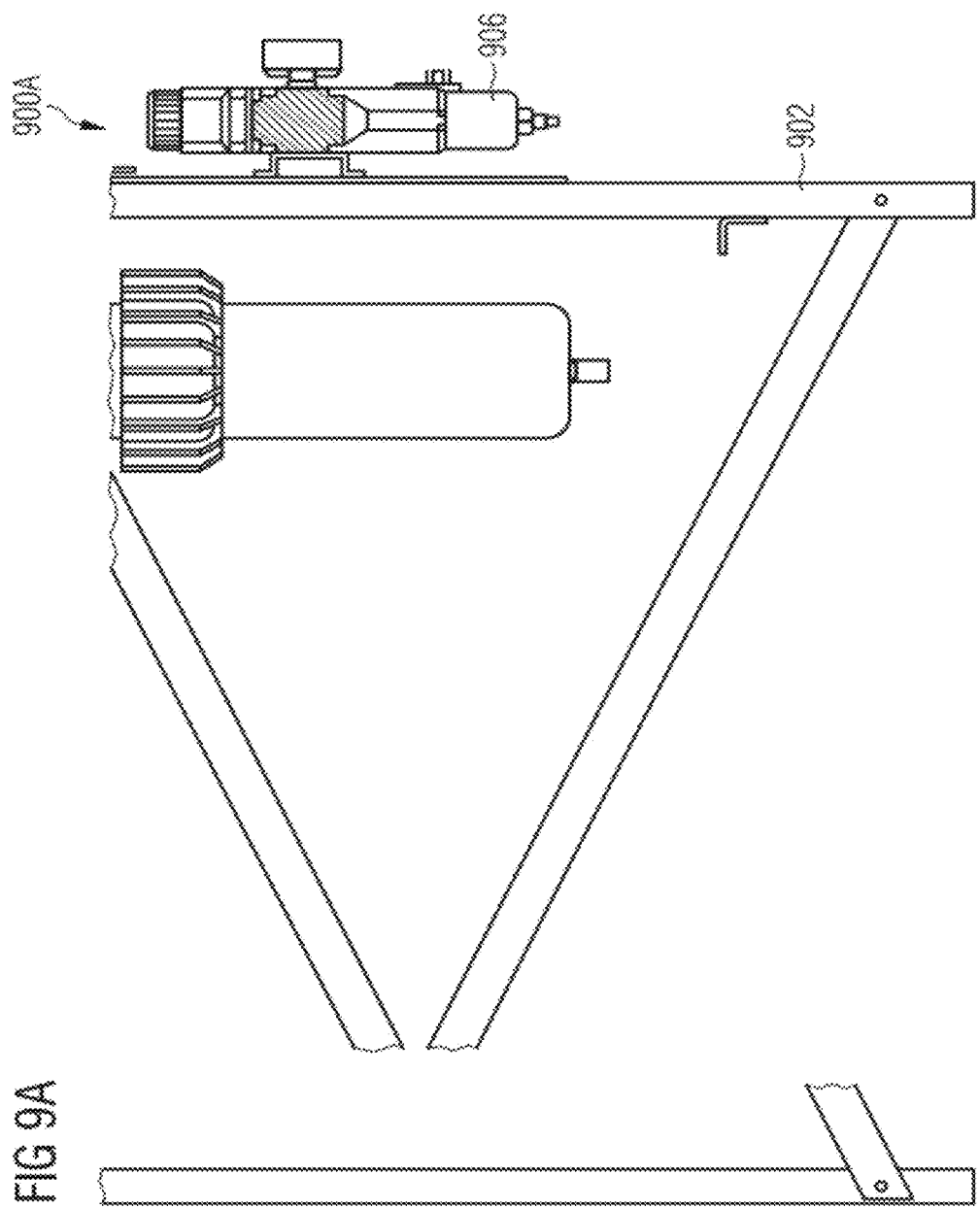

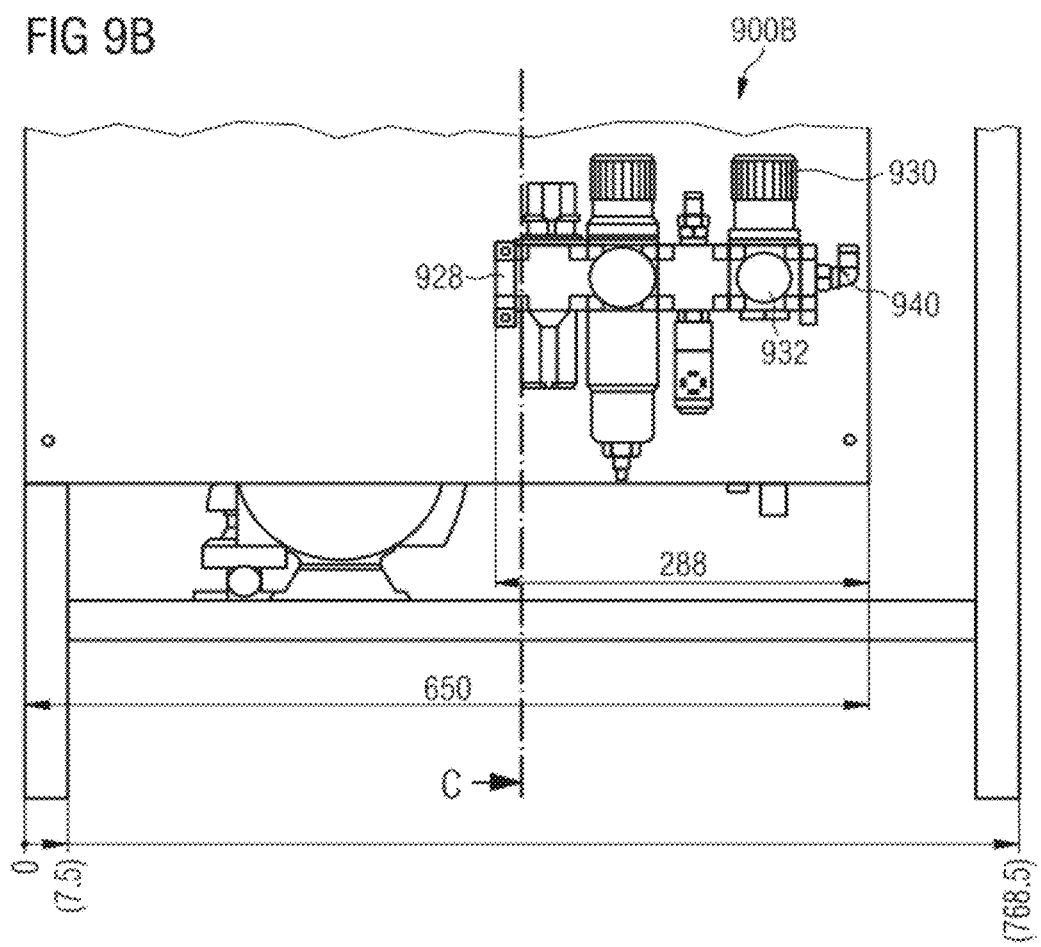

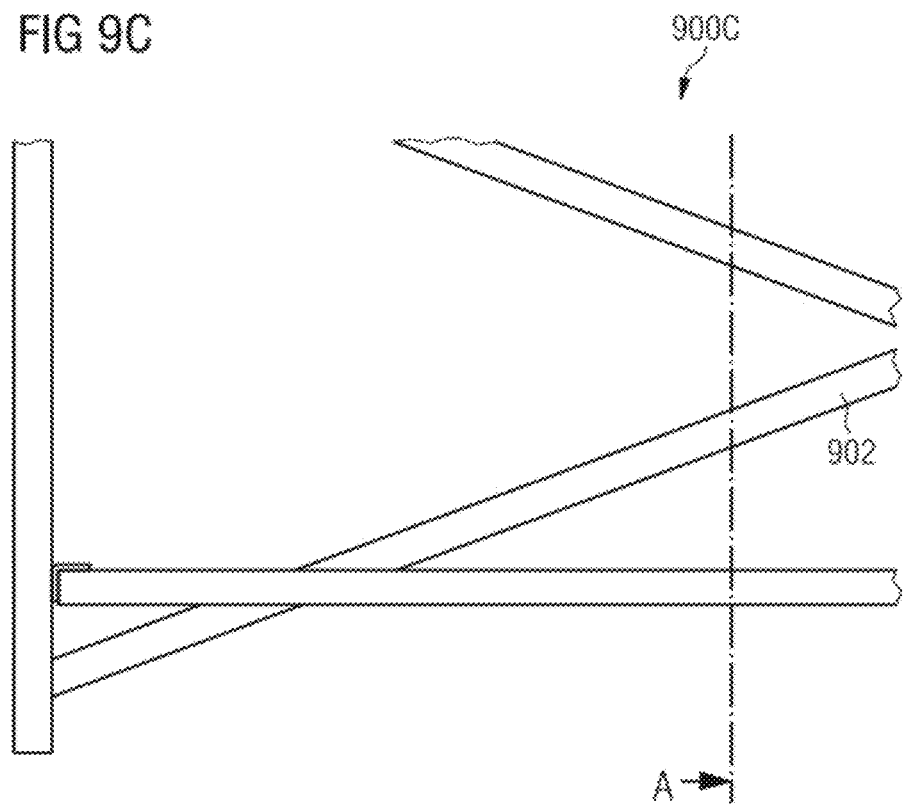

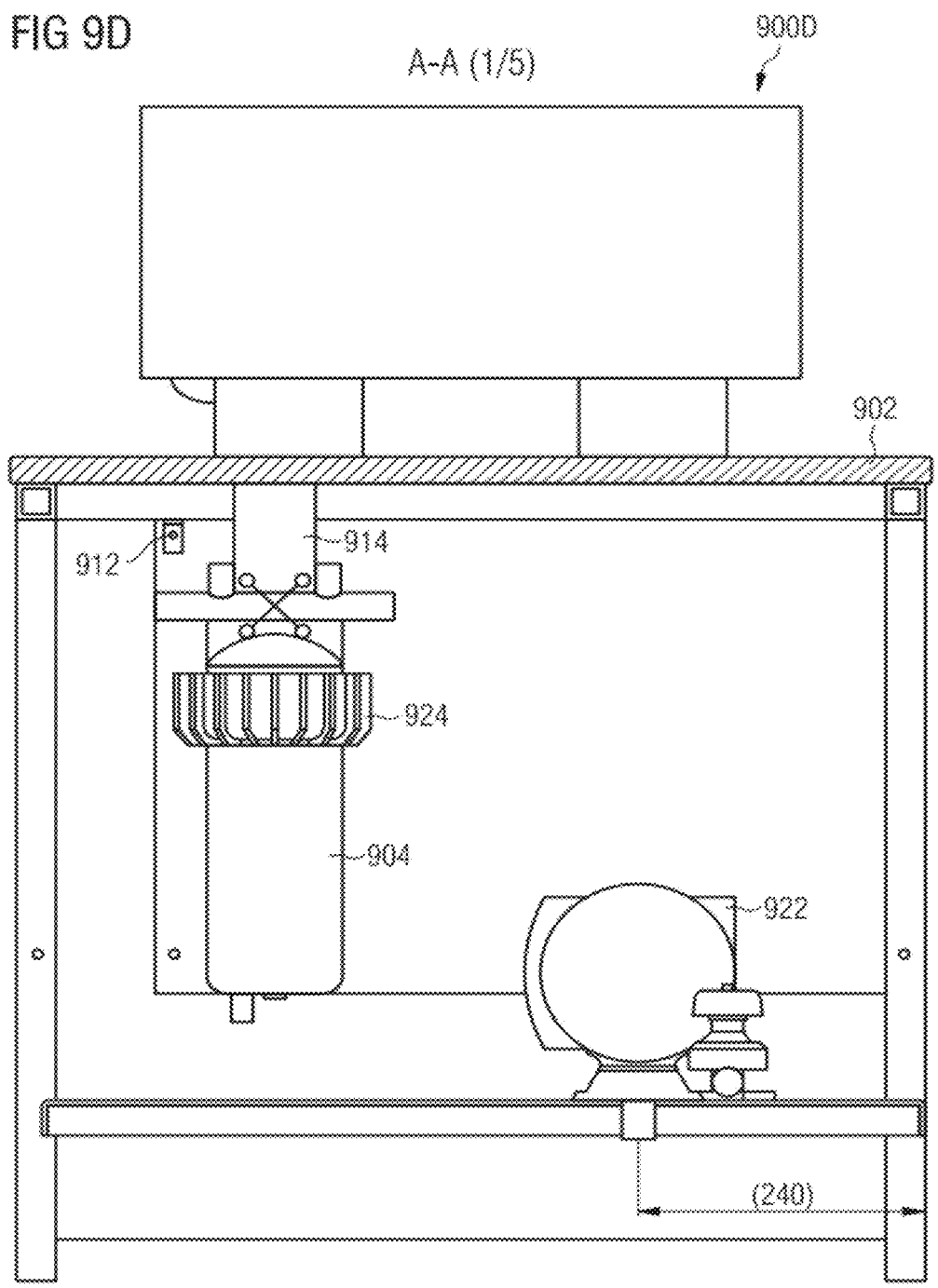

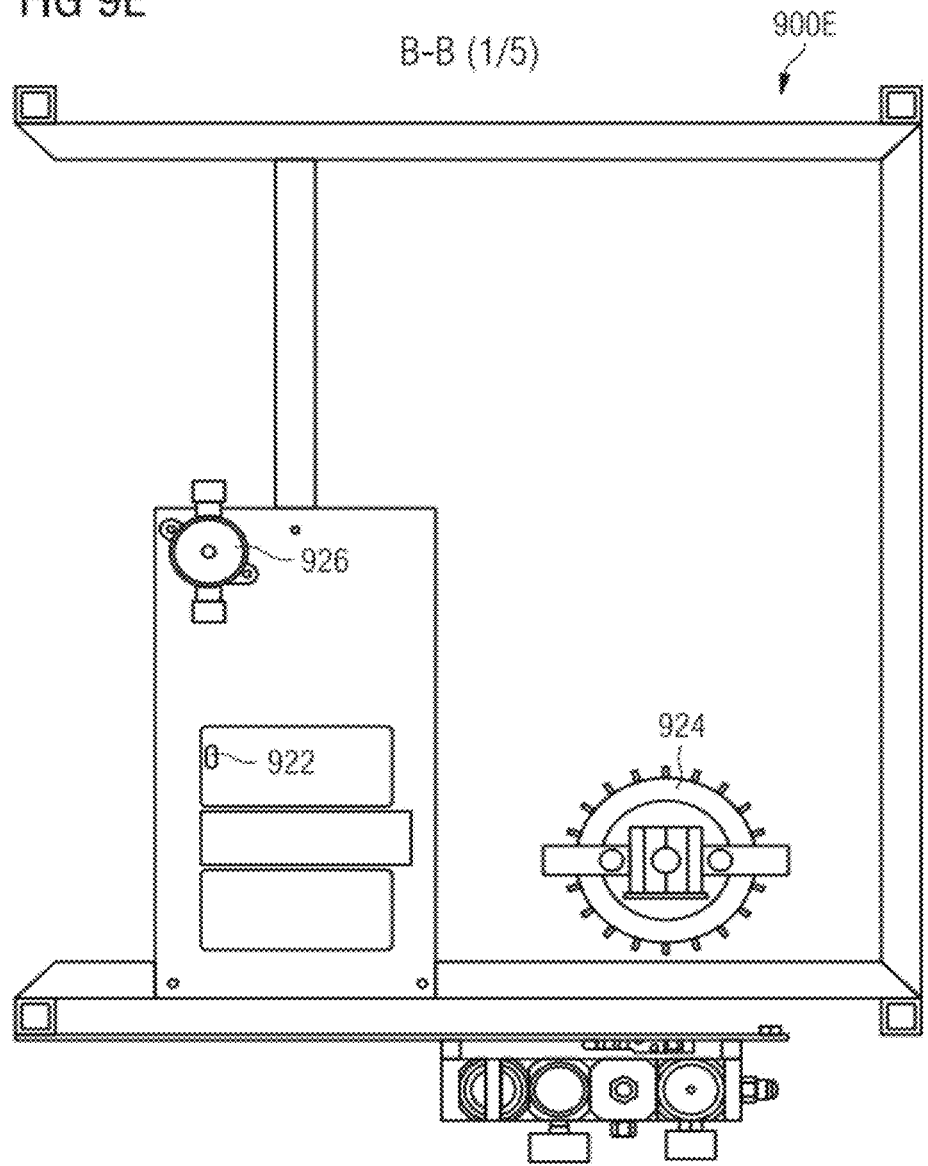

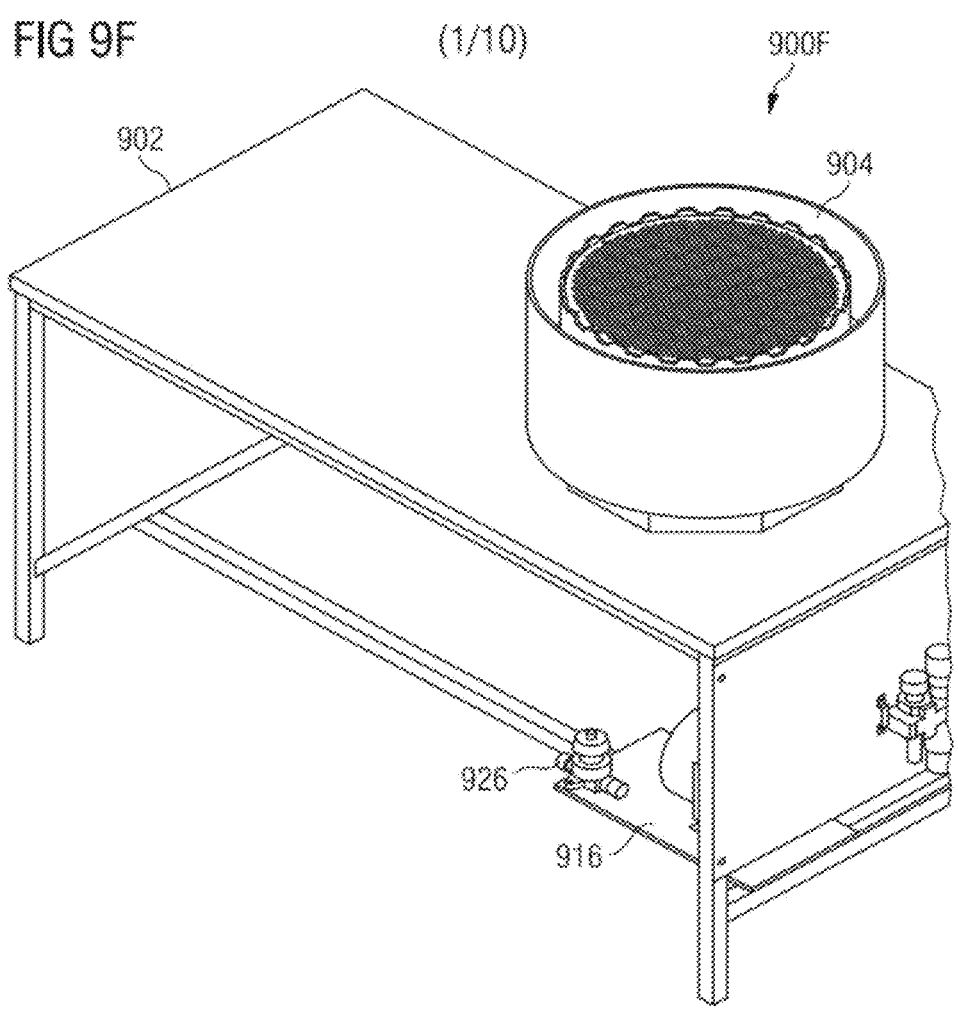

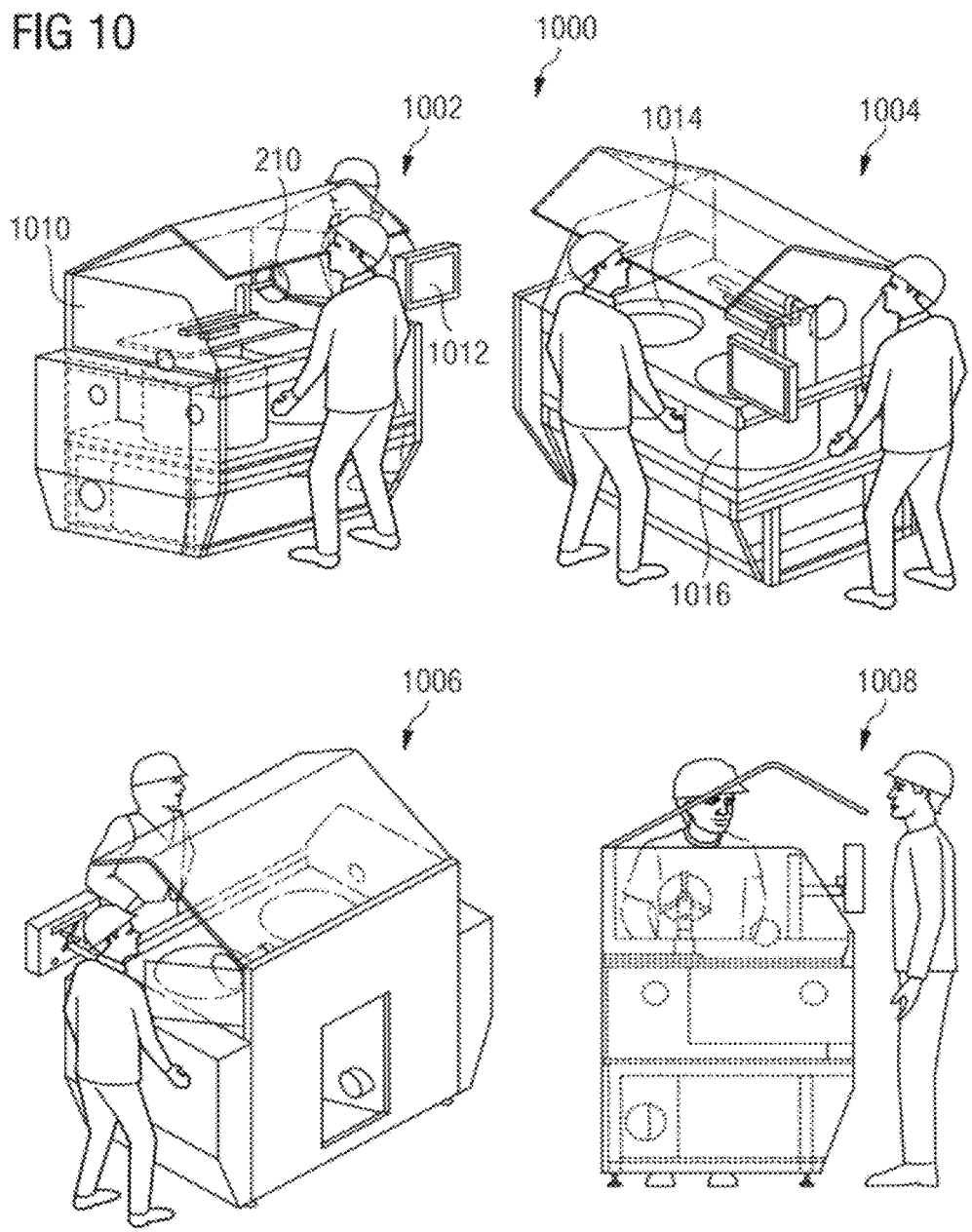

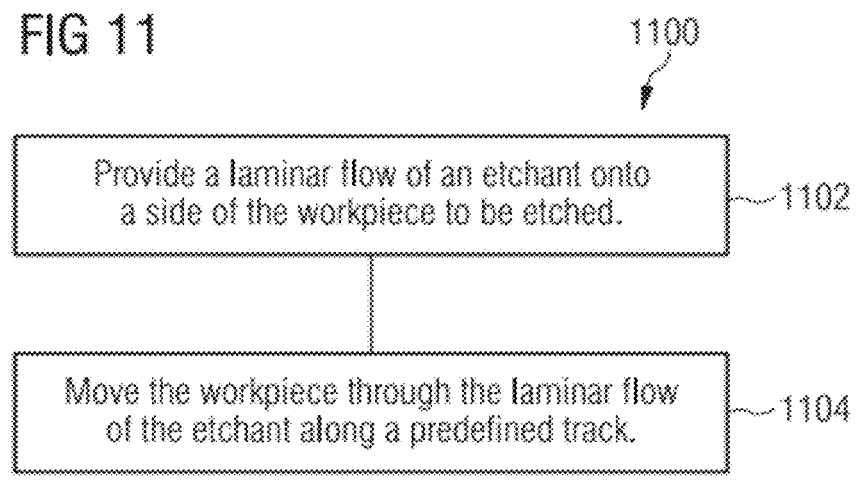

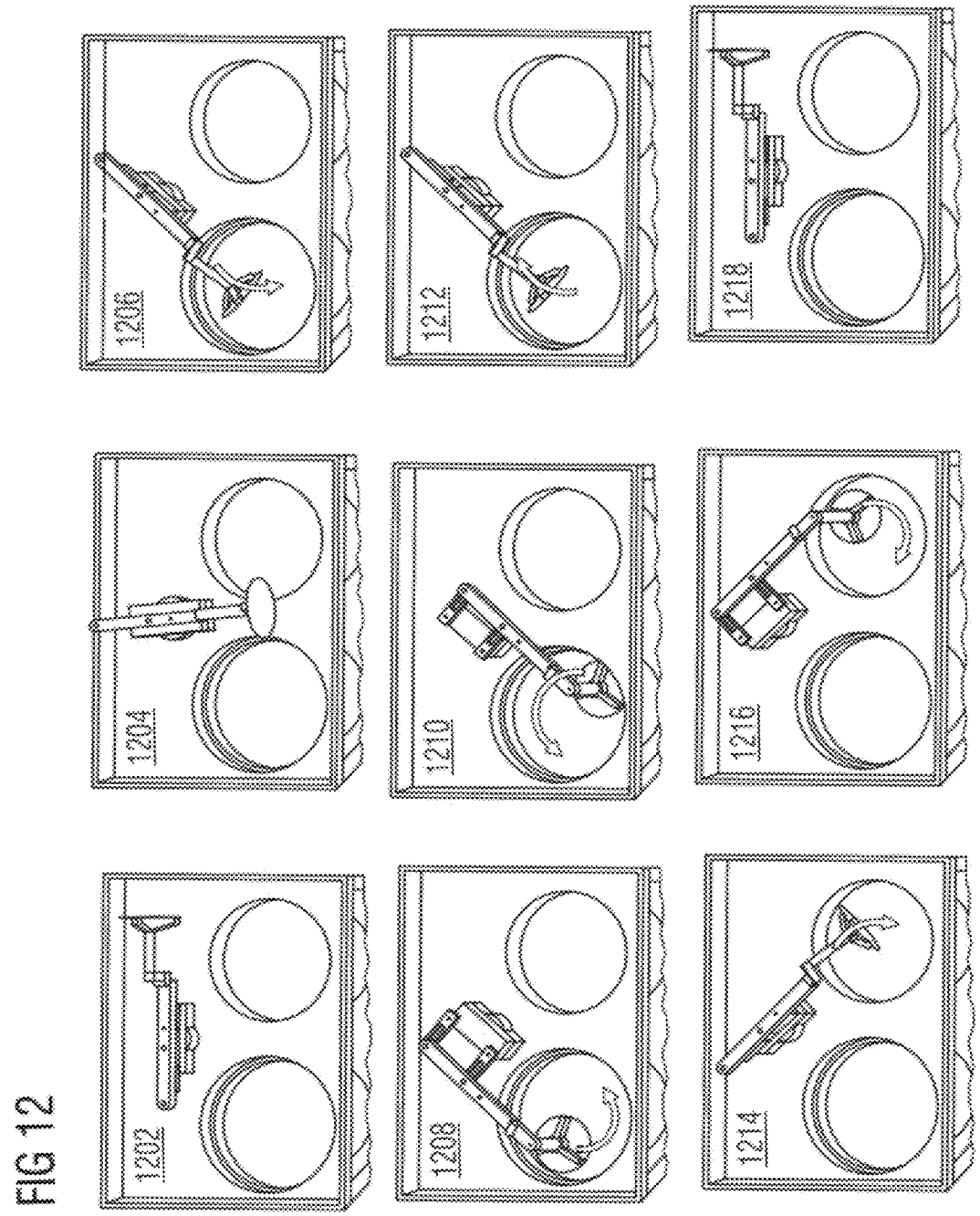

ETCHING DEVICE AND A METHOD FOR ETCHING A MATERIAL OF A WORKPIECE

TECHNICAL FIELD

Various embodiments relate generally to an etching device and a method for etching a material of a workpiece.

BACKGROUND

Two mainstream metallization schemes for the deposition of copper currently exist for copper wiring or the provision of copper interconnects in semiconductor devices.

The dual damascene process is used for fine pitch metallization and is mainly used in logic and memory devices. In the dual damascene processes, a via may be etched, e.g. dry etched, beneath a patterned isolation layer such as silicon nitride. Copper may then be plated in the via. Chemical mechanical polishing (CMP) may then be used to clean the wafer surface from copper and to separate the copper lines from each other. Due to the costly reactive ion etching (RIE), copper plating and CMP processing, this metallization scheme is mainly used for signal wiring where low electric current allows thin layer processing.

Pattern plating of copper is conventionally used for applications requiring thick copper lines and electrically conductive bumps, such as copper bump arrays in wafer packaging. Copper may be plated using a resist mask which may be substantially thicker than the desired copper thickness. This metallization scheme is mainly used for high power devices where a high electric current has to be transported in the metal lines. Pattern copper plating is less expensive than the dual damascene metallization approach, however, the lithographic process to create a high standing mask and the plating process itself is very costly.

Once copper metallization has been carried out, patterning of a copper metallization layer may be carried out.

A first method of patterning a copper metallization layer is by carrying out a patterned copper etch. Patterned etching of a layer of copper may be carried out through a resist mask and using a copper wet etching chemistry, the wet etching chemistry being a chemical etchant. Although the patterned wet etch scheme is commonly used for structuring or etching other metals such as aluminum on a semiconductor wafer, it is not a feasible scheme to use for copper etching in the semiconductor industry because the copper etch process is highly influenced by the flow dynamics of the chemical etchant on the wafer.

The tools which are commercially available for wet processing or wet etching of metals, such as copper, offer a variety of different flow dynamics. One common tool for front end of line processing is the automated batch tank tool. Wafers that have structures to be etched may be immersed completely in a tank full of chemical etchant. The chemical etchant may be flowing homogenously through the tank from a diffuser located at the bottom of a tank. The etchant may be re-circulated using an overflow rinse. The flow dynamics of such a tool provides a very poor uniformity to the wafer etch due to the lack of control of flow dynamics.

Another common tool for carrying out a wet etch of a wafer surfaces to be etched is the a Spray Acid Tool (SAT). Wafers (in a batch 25-50) may be rotating within a process chamber while a chemical etchant is provided via spray nozzles above the wafer. The chemical etchant may be distributed over the surface of the wafer to be etched and is replaced by a combination of using a centrifugal force to provide rotation of the wafer and on the other hand by providing a new supply of chemical etchant provided by the spray nozzles. However, uniformity provided by the spray acid tool is highly dependent on the maximum flow of chemical etchant achievable.

As shown above both processes, the tank tool and the spray tool do not provide sufficient uniformity to be used as a direct metal (copper) structuring process suitable for the semiconductor industry.

SUMMARY

An embodiment is an etching device including a process chamber including an etchant; a structure configured to provide a laminar flow of the etchant; and a workpiece handler configured to move a workpiece through the laminar flow of the etchant along a predefined track.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 8A to 8F show illustrations of an etching device in accordance with various embodiments;

FIGS. 9A to 9F show illustrations of an etching device in accordance with various embodiments;

FIG. 10 shows an implementation of an etching device in accordance with one embodiment;

FIG. 11 shows a method for etching a material of a workpiece in accordance with one embodiment;

FIG. 12 shows a method for etching a material of a workpiece in accordance with one embodiment;

DETAILED DESCRIPTION

The following detailed description refers to the accompanying drawings that show, by way of illustration, specific details and embodiments in which the invention may be practiced. The word "exemplary" is used herein to mean "serving as an example, instance, or illustration". Any embodiment or design described herein as "exemplary" is not necessarily to be construed as preferred or advantageous over other embodiments or designs.

Various embodiments provide an etching device for the uniform etching of a copper layer by providing a laminar flow of the etchant over the surface of a wafer and moving a wafer through the laminar flow to provide a well-controlled and uniform diffusion of etchant to the substrate surface.

Figure 1:
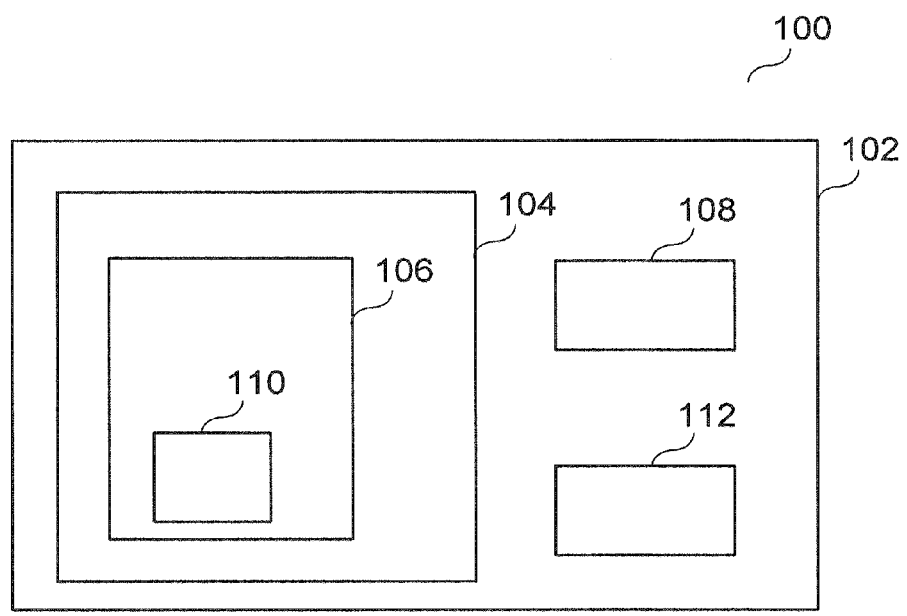
FIG. 1 shows an etching device in accordance with one embodiment.

FIG. 1 shows an illustration 100 of an etching device 102 in accordance with one embodiment. The etching device 102 may include a process chamber 104 including an etchant 106, a structure 108 configured to provide a laminar flow of the etchant 106, and a workpiece handler 112 configured to move a workpiece 110 through the laminar flow of the etchant 106 along a predefined track.

According to an embodiment, the etching device 102 may be an etching device configured to carry out an etching process, wherein an etchant 106 may be configured to etch a part of the workpiece 110.

According to an embodiment, the etching device 102 may include an etching device configured to carry out a wet etch (which may also be referred to as wet chemical etch) on a workpiece 110.

According to an embodiment, the etchant 106 may be configured to remove a material and/or part of a material from the workpiece 110.

According to an embodiment, the etchant 106 may be configured to form and/or shape a structure in the workpiece 110 by removing a material and/or part of a material from a workpiece 110. According to an embodiment, the etchant 106 may be configured to form and/or shape a structure by etching uniformly an entire surface area of the workpiece 210 through a structure mask. According to an embodiment, the etchant 106 may include a liquid.

According to an embodiment, the etchant 106 may include an etchant bath.

According to an embodiment, the etchant 106 may include a liquid chemical bath.

According to an embodiment, the etching device 102 may be an etching device configured to carry out an isotropic wet etch on a workpiece 110.

According to an embodiment, the workpiece 110 may include a material to be etched such as e.g. a metal, e.g. copper, and/or aluminum. According to an embodiment, the workpiece 110 may include a material to be etched such as polysilicon (doped or undoped), silicon (doped or undoped). According to an embodiment, the workpiece 110 may include a CMOS front end of line (FEOL) processing material to be etched.

According to an embodiment, the workpiece 110 may include a CMOS back end of line (BEOL) processing material to be etched.

According to an embodiment, the workpiece 210 may be a wafer. According to an embodiment, the wafer 210 may be a semiconductor wafer.

According to an embodiment, the workpiece 210 may be a solar cell.

According to an embodiment, the workpiece 210 may be a printed circuit board.

According to an embodiment, the workpiece 210 may include a carrier, wherein the carrier material may include any one of glass (e.g. borosilicate, aluminosilicate), quartz, sapphire, plastic and/or a metal.

According to an embodiment, the carrier may be a substrate for supporting devices, e.g. mechanical and/or electronic devices.

According to an embodiment, the process chamber 104 may include a chemical storage tank. According to an embodiment, the process chamber 104 may include a beaker. According to an embodiment, the process chamber 104 may be configured to contain an etchant 106.

The basic functionalities of the features described with respect to FIG. 1 will be referred to and are applicable throughout all the various embodiments which will be described in more detail below. Identical features as to those described in FIG. 1 are denoted with the same reference signs.

Figure 2:
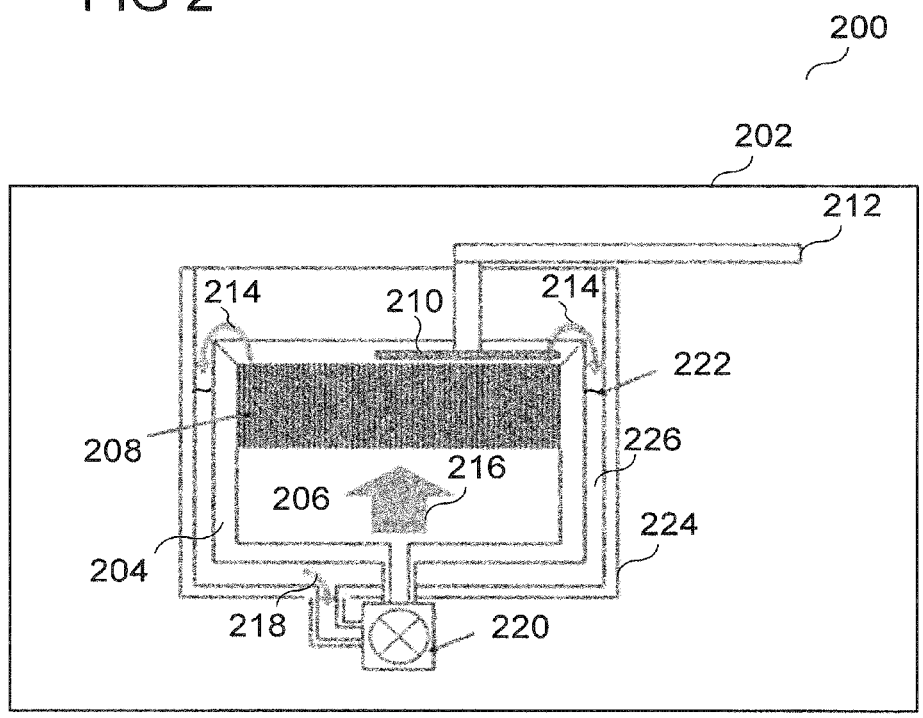
FIG. 2 shows an etching device in accordance with one embodiment.

FIG. 2 shows an illustration 200 of an etching device 202 in accordance with one embodiment. The etching device 202 may include a process chamber 204 including an etchant 206, a structure 208 configured to provide a laminar flow of the etchant 206, and a workpiece handler 212 configured to move a workpiece 210 through the laminar flow of the etchant 206 along a predefined track. The structure 208 may be a collimator grid or collimator plate. Oriented chemical flow of an etchant may be provided via the collimator grid. The structure 208 may be configured to include holes through which the etchant 206 may be pressed, e.g. by means of a pump 220.

A pump 220 may be provided to provide a flow of etchant 206 through the process chamber 204, that is, to provide a circulation of fresh etchant 206 within the process chamber 204. A pump 220 may be provided to provide a flow of etchant 206 towards the structure 208 in the direction indicated by the arrow 216. The workpiece 210 may be placed so that a laminar flow reaches the side of the workpiece to be etched. In this case, the workpiece 210 is placed face down in the chemical etchant 206. An overflow of the etchant indicated by the arrows 214 may flow into an overflow tank 224. The overflow of etchant may be forced by the pump to re-enter, the process chamber 204 as indicated by arrow 218 forming an etchant 206 within the process chamber 204. The amount of etchant in the overflow tank 224 may be kept at a pre-determined level 222.

According to an embodiment, the pump 220 may be configured to direct a flow of etchant through a structure 208.

According to an embodiment, the structure 208 configured to provide a laminar flow of the etchant may include a structure configured to convert a the turbulent flow of etchant into a laminar flow of etchant.

According to an embodiment, the pump 220 may be configured to direct a flow of etchant having a turbulent flow through a structure 208 which converts the turbulent flow of etchant into a laminar flow of etchant.

According to an embodiment, a turbulent flow of the etchant 206 may include streams of etchant flow which are non-uniformly directed in relation to each other, and/or which include eddy currents and/or churning and/or vortices.

According to an embodiment, a laminar flow of the etchant 206 may include one or more parallel layers of etchant flow.

According to an embodiment, a laminar flow of the etchant 206 may include one or more parallel layers of etchant flow wherein each of the one or more parallel layers of etchant flow interferes only minimally with another of the one or more parallel layers of etchant flow.

According to an embodiment, a laminar flow of the etchant 206 may include parallel layers of etchant flow which are each substantially free of eddy currents and/or churning and/or vortices.

According to an embodiment, a laminar flow of etchant may be a streamlined stream of etchant flow.

The basic functionalities of the features described with respect to FIG. 2 will be referred to and are applicable throughout all the various embodiments which will be described in more detail below. Identical features as to those described in FIG. 2 are denoted with the same reference signs.

Figure 3A:
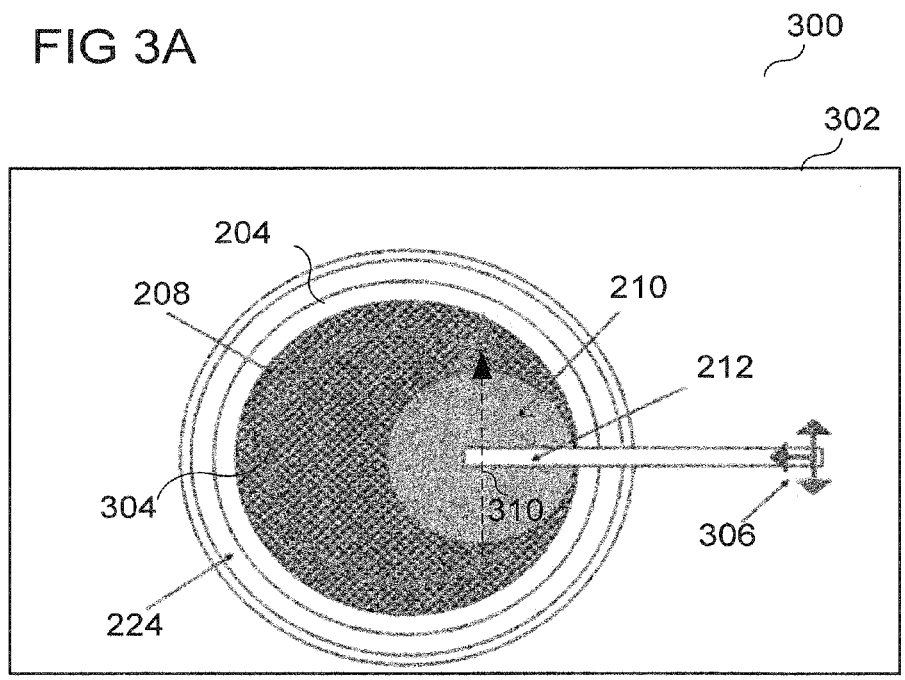
FIGS. 3A and 3B show an etching device in accordance with various embodiments.
Figure 3B:
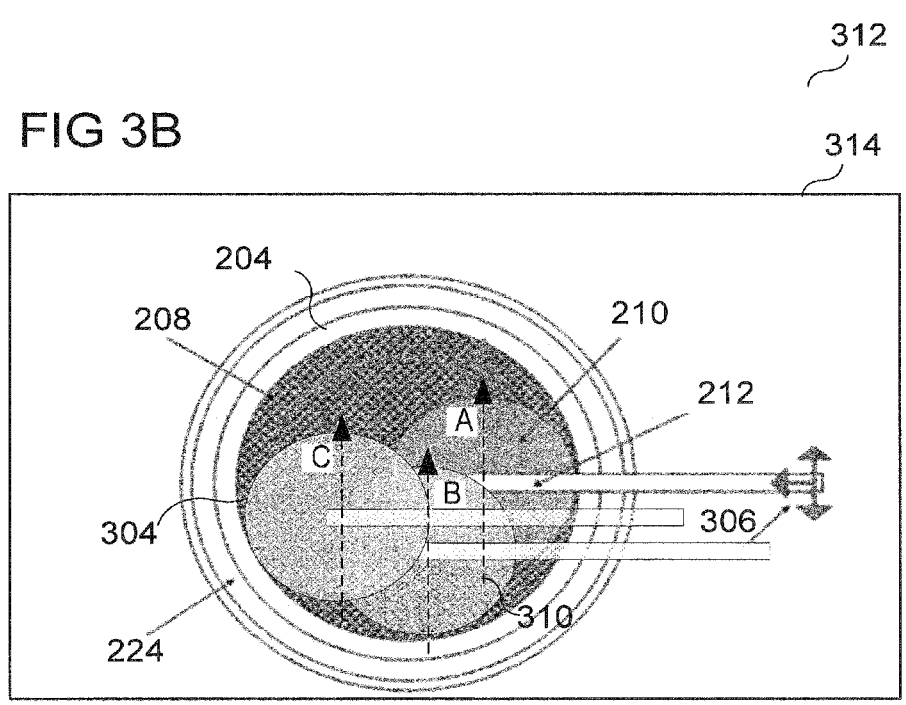

FIG. 3A shows an illustration 300 of an etching device 302 in accordance with one embodiment. The etching device 302 may be an etching device 302 which may include the features disclosed in the etching device 202 described with respect to FIG. 2. The etching device may further include a multiaxial handling system, 306 e.g. a robot which may be connected to the workpiece handler 212 to control the movement of the workpiece 210. The movement of the workpiece 210 may be controlled by the multiaxial handling system 306 and the workpiece handler 212, e.g. implemented as an arm of a robot, such that the center of rotation is outside the workpiece 210. The workpiece handler 212 may be configured to move a workpiece 210 through the laminar flow of the etchant 206 along a predefined track wherein the predefined track may form at least part of a loop 304. The multiaxial handling system 306, e.g. a robot, may be provided to move the workpiece 210 through the laminar flow without proper rotation. According to an embodiment, the workpiece 210 may be defined by an axis 310 of the workpiece, wherein the axis 310 may be configured to lie in parallel to a side of the workpiece to be etched, and wherein the workpiece handler 212 may be configured to move a workpiece 210 through the laminar flow of the etchant 206 along a predefined track such that the axis 310 of the workpiece, always points in the same direction. FIG. 3B shows an illustration 312 of an etching device 302 in accordance with one embodiment.

FIG. 3B shows an illustration 312 of an etching device 314 in accordance with one embodiment, wherein the workpiece handler 212 may be configured to move a workpiece 210 through the laminar flow of the etchant 206 along a predefined track wherein the predefined track may form at least part of a loop 304, from a position A to position B to position C. An axis 310 of the workpiece configured to lie in parallel to a side of the workpiece to be etched points in the same direction when the workpiece 210 is at position A, B and C. The workpiece 210 may be fixed in relation to a portion of the workpiece handler 210, and may be configured not to spin or rotate about any axis located within the workpiece 210, such that any movement of a workpiece 210 within the laminar flow is restricted to a workpiece 210 surface moving along a single two-dimensional plane along a predefined track. According to a further embodiment, a workpiece 210 may be configured to move along a single two-dimensional plane along a predefined track, while the workpiece 210 may be configured to rotate or spin about an axis with respect to the workpiece 210.

The basic functionalities of the features described with respect to FIG. 3 will be referred to and are applicable throughout all the various embodiments which will be described in more detail below. Identical features as to those described in FIG. 3 are denoted with the same reference signs.

Figure 4:
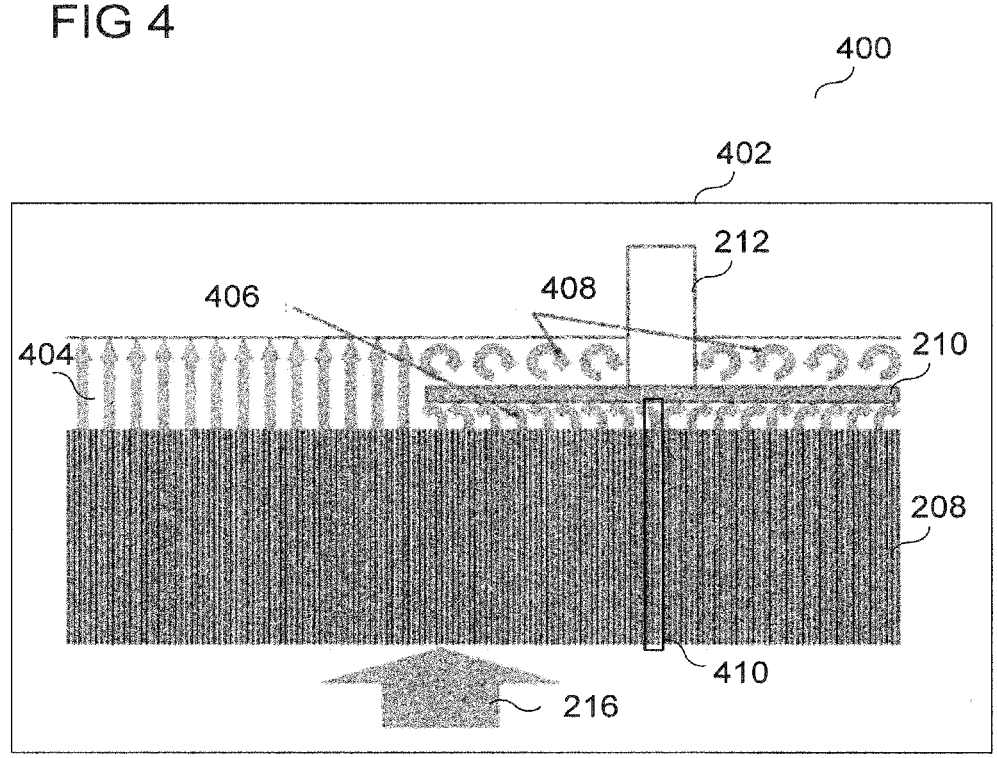
FIG. 4 shows an etching device in accordance with one embodiment.

FIG. 4 shows an illustration 400 of an etching device in accordance with one embodiment. The etching device 402 may be an etching device 402 which may include the features disclosed in the etching devices 202, 302 already described with respect to FIGS. 2 and 3. FIG. 4 shows how a laminar flow of etchant 206 may be provided using a pump 220 to provide a flow of etchant through a structure 208, e.g. a collimator grid, for producing a laminar flow 404.

According to an embodiment, the structure 208 configured to provide a laminar flow of the etchant 206 may be a structure 208 configured to create a streamline flow of etchant.

According to an embodiment, the structure 208 may include a plurality of channels 508 guiding the etchant 206 to thereby provide the laminar flow. According to an embodiment, the channels 508 may be formed by an array of pipes being arranged in a predefined manner to provide the laminar flow. According to an embodiment, the plurality of channels may be configured to be arranged in parallel with each other. According to an embodiment, the structure 208 may include a plate 510, the plate 510 comprising a plurality of through-holes as the plurality of channels 508. According to an embodiment, the plurality of channels may be configured to be parallel to each other.

According to an embodiment, the structure 208 may include a nozzle for expelling an individual streamline of etchant flow.

According to an embodiment, the structure 208 may include a plurality of nozzles arranged in parallel to each other configured to expel a plurality of individual streamlined streams of etchant flow in parallel to each other.

According to an embodiment, each pipe or channel of the plurality of channels may be configured to create an individual streamlined stream of etchant flow.

According to an embodiment, an individual streamlined stream of etchant flow and/or individual laminar flow of the etchant 206 in a channel may be configured to have a Reynolds number $R_l$, wherein $R_l$ may be expressed by the formula, $R_l = ud/v$, wherein u may be the mean velocity (m/s) of the etchant flow with respect to the channel walls, d (m) may be the hydraulic diameter of the pipe and v (m$^2$/s) may be the kinematic viscosity of the etchant flow.

According to an embodiment, an individual streamlined stream of etchant flow and/or individual laminar flow of the etchant 206 in a channel may be configured to have a Reynolds number $R_l$, wherein $R_l$ may be less than a critical Reynold's number $R_{cl}$, e.g. $R_l < R_{cl}$. e.g. $1 < R_{cl} < 2300$, $300 < R_{cl} < 1800$, $500 < R_{cl} < 1200$.

According to an embodiment, a turbulent flow of etchant may be configured to have a Reynold number $R_t$, wherein $R_t$ may be greater than a critical Reynold's number $R_{ct}$, e.g. $R_t > R_{ct}$. e.g. $2500 < R_{ct} < 10000$, $2500 < R_{ct} < 5000$, $2500 < R_{ct} < 4000$.

According to an embodiment, each pipe or channel of the plurality of channels may be configured to create an individual streamlined stream of etchant flow, such that when a plurality of said pipes or channels are arranged in parallel with each other to form a structure 208, a plurality of individual streamlined streams of etchant flow may created, wherein the plurality of individual streams of etchant flow are configured to be arranged in parallel with each other, and wherein each of the individual streams of etchant flow are configured to interfere only minimally with each other. According to an embodiment, each of the individual streamlined streams of etchant flow are substantially free of eddy currents and/or churning and/or vortices.

According to an embodiment, a structure 208 configured to provide a laminar flow of the etchant 206 may be configured to provide a laminar flow of the etchant 206 having a Reynold number $R_l$, wherein $R_l$ may be less than a critical Reynold's number $R_{cl}$, e.g. $R_l < R_{cl}$. e.g. $1 < R_{cl} < 2300$, $300 < R_{cl} < 1800$, $500 < R_{cl} < 1200$.

Laminar flow of etchant 206 arriving on the surface or a side of a workpiece 210 to be etched is indicated by the arrows 406. Turbulence of the etchant 408 may be created on the side of the workpiece opposite to the side of the workpiece 210 facing the direction of laminar flow of the etchant, .i.e. the side of the workpiece 210 to be etched. The basic functionalities of the features described with respect to FIG. 4 will be referred to and are applicable throughout all the various embodiments which will be described in more detail below. Identical features as to those described in FIG. 4 are denoted with the same reference signs.

Figure 5:
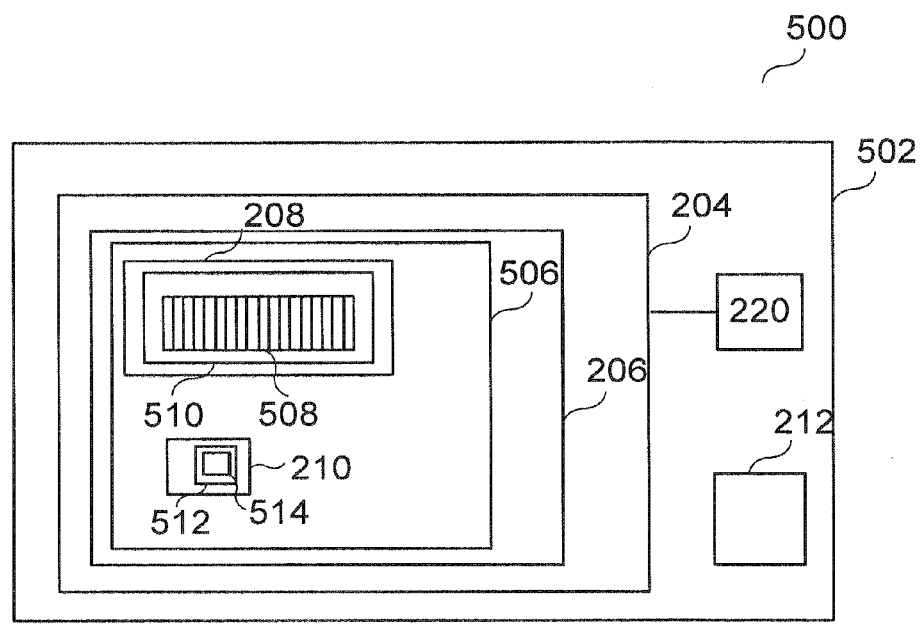
FIG. 5 shows an etching device in accordance with one embodiment.

FIG. 5 shows an illustration 500 of an etching device in accordance with one embodiment. The etching device 502 may be an etching device 502 which may include the features disclosed in the etching devices 202, 302, 312, 402 described with respect to FIGS. 2, 3 and 4. The etching device 502 may include a process chamber 204 including an etchant 206, a structure 208 configured to provide a laminar flow of the etchant 206, and a workpiece handler 212 configured to move a workpiece 210 through the laminar flow of the etchant 206 along a predefined track.

According to an embodiment, the workpiece handler 212 may be configured to move a workpiece 210 through the laminar flow of the etchant 206 repeatedly along a predefined track.

According to an embodiment, the predefined track lies in a two-dimensional plane.

According to an embodiment, the predefined track may trace a two-dimensional plane wherein the two-dimensional plane may be configured to be at a fixed angle with respect to the structure 208 providing the laminar flow.

According to an embodiment, the predefined track may trace a two-dimensional plane wherein the two-dimensional plane may be configured to be at a pre-determined distance with respect to the structure 208 providing the laminar flow and wherein the distance between the two-dimensional plane and the structure may be increased or decreased during the etching process. According to an embodiment the predefined track may be configured to ensure that the workpiece 210 lies within the laminar flow of the etchant.

According to an embodiment, the predefined track may form at least a part of a loop 304 wherein a center of the loop may be located outside the workpiece.

According to an embodiment, the loop 304 may form a closed loop, e.g. a circular closed loop, a rectangular closed loop, a trapezoidal closed loop, a polygonal closed loop.

According to an embodiment, the loop 304 may form a substantially closed loop e.g. a circular substantially closed loop, a rectangular substantially closed loop, a trapezoidal substantially closed loop, a polygonal substantially closed loop.

According to an embodiment, the process chamber 204 may include a process tank 506 configured to receive the etchant 206.

According to an embodiment, the etching device 502 may be configured to generate a flow of the etchant 206 through the process tank 506.

According to an embodiment, the laminar flow of the etchant 206 may be configured to etch a side of the workpiece 210.

According to an embodiment, the etching device 502 may be configured such that the rate of laminar flow of the etchant 206 to a side of the workpiece 210 to be etched is greater than the rate of flow of the etchant 206, due to at least one of diffusion, convection and gravitation, to the side of the workpiece 210 to be etched.

According to an embodiment, the plate 510 may be at least twice as large as the workpiece 210. According to an embodiment, the etching device 502 may further include at least one pump 220 connected to the process chamber to provide the flow of the etchant through the process tank 506.

According to an embodiment, the workpiece handler 212 may be configured to move the workpiece 210 through the laminar flow of the etchant 206 without proper motion of the workpiece 210 with respect to the workpiece handler 212.

According to an embodiment, the workpiece handler 212 may be configured to move the workpiece through the laminar flow of the etchant 206 without proper rotation of the workpiece 210 with respect to the workpiece handler 212.

According to an embodiment, a side of the workpiece 210 to be etched may be configured to be at fixed angle with respect to the direction of laminar flow of the etchant 206.

According to an embodiment, a side of the workpiece 210 to be etched may be configured to be rotated or spun with respect to the direction of laminar flow of the etchant 206.

According to an embodiment, a side of the workpiece 210 to be etched may be configured to be substantially perpendicular to the laminar flow of the etchant 206.

According to an embodiment, the workpiece 210 may include a structure to be etched 512.

According to an embodiment, the structure to be etched 512 may include a material 514 which can be etched using a diffusion controlled etching process using the etchant 206.

According to an embodiment, the structure to be etched 512 may include a material that is used in semiconductor processing which may be subjected to a wet chemical etch. According to an embodiment, the material may include a semi-metal and/or semiconducting material and/or an electrically conducting material such as e.g. a metallically conductive material, and/or an isolation material, and/or at least one material 514 selected from a group consisting of: copper, polysilicon (doped or undoped), silicon (doped or undoped) and/or aluminum, titanium, tungsten, silicon nitride, silicon dioxide, quartz glasses, silicate glasses, e.g. boron or natrium doped silicate glasses, and plastics, e.g. PET.

According to an embodiment, the direction of laminar flow of etchant 206 may be provided from a bottom to top direction as shown according to FIG. 2A workpiece 210 may therefore be placed facing downwards such that a side or surface of the workpiece 210 to be etched directly meets the direction of laminar flow of the etchant 206.

Figure 13A:
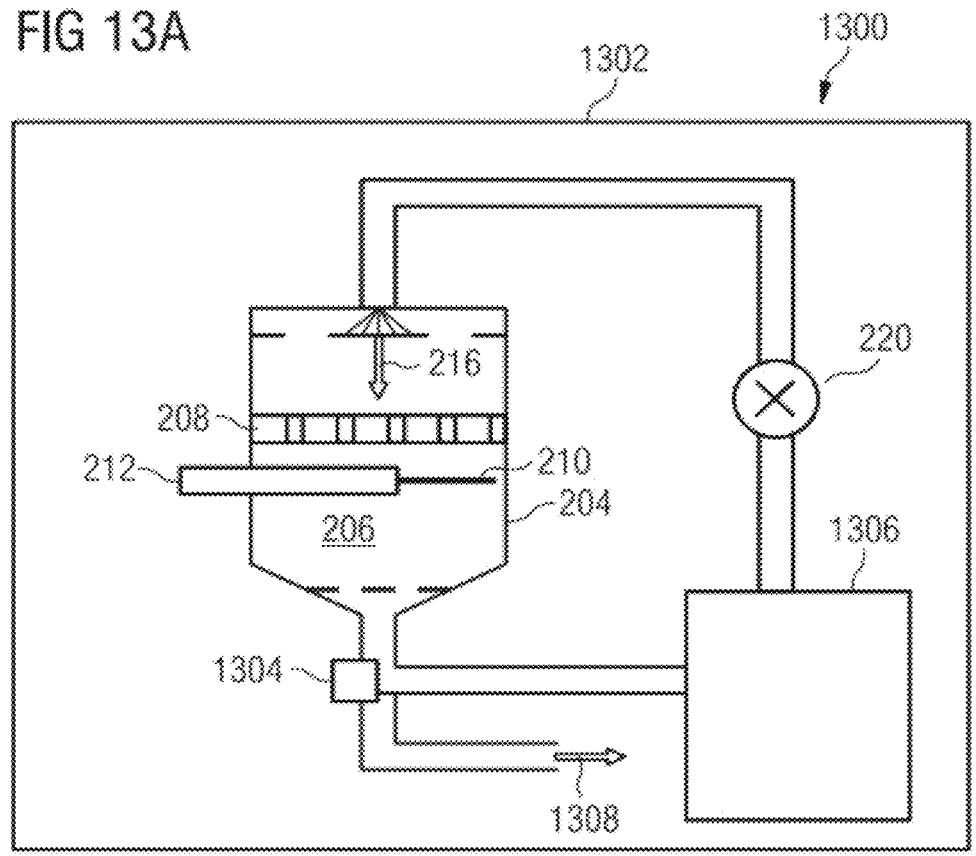
FIGS. 13A and 13B show illustrations of an etching device in accordance with one embodiment.
Figure 13B:
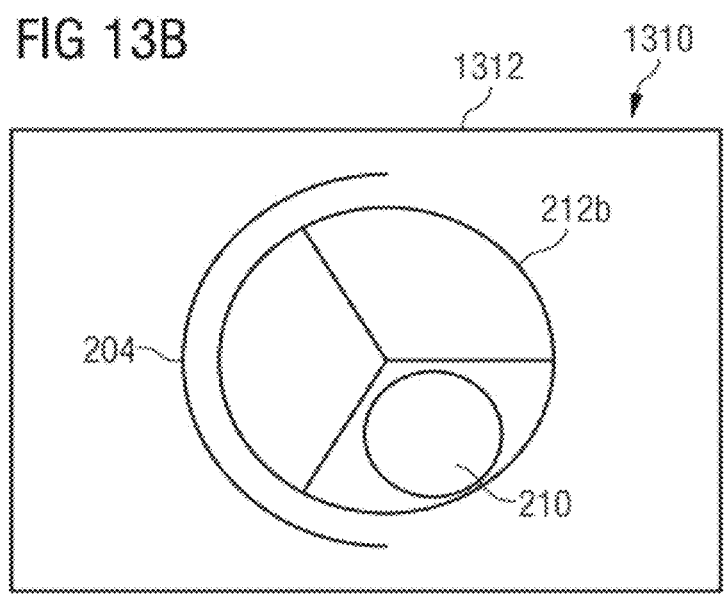

According to an embodiment, the direction of flow of etchant may be provided from a top to bottom direction according to an etching device 1302 as shown in an illustration 1300 of FIG. 13A. A workpiece 210 may therefore be placed facing upwards such that a side or surface of the workpiece 210 to be etched directly meets the direction of laminar flow of the etchant 206 which may be in a top to bottom direction. A pump 220 may be used to pump an etchant 206 from a chemical tank 1306 into process chamber 204 in a top to bottom direction 216. In an embodiment, a valve 1304 may be used to direct a flow of etchant away from the chamber towards the chemical tank to be re-pumped into the process chamber 204, or to direct a flow of etchant 206 away from the process chamber 204 towards a drain 1308. FIG. 13B shows an illustration 1310 of part of an etching device 1312 wherein the workpiece handler 212 may further include a workpiece holder 212b for holding the workpiece 210 wherein the workpiece handler may be configured to move the workpiece 210 through the laminar flow of the etchant 106 along a predefined track.

Figure 14A:
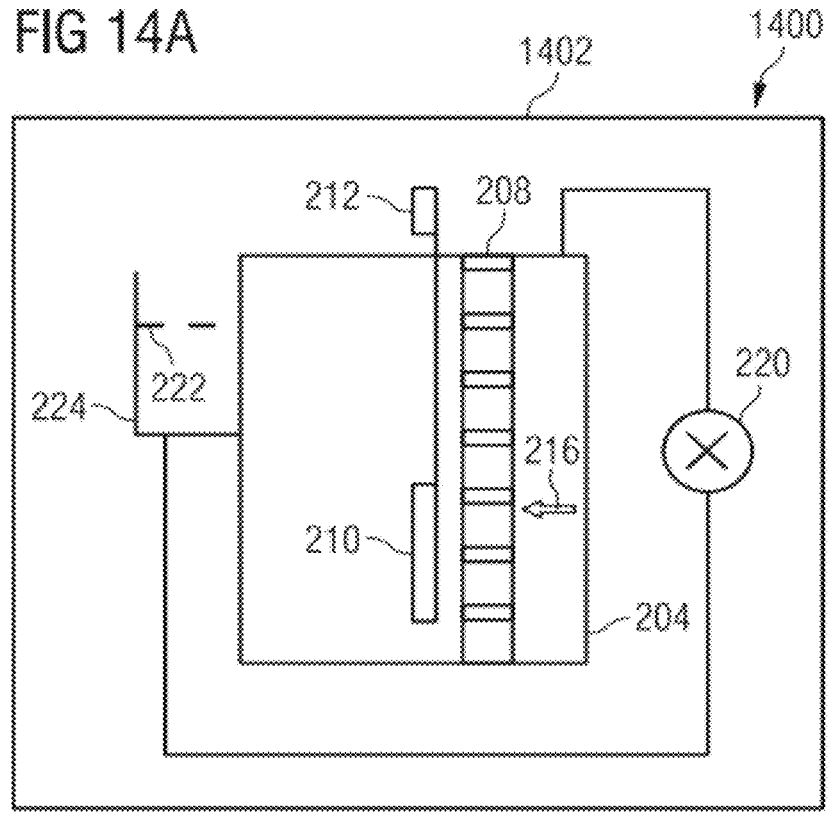
FIGS. 14A and 14B show illustrations of an etching device in accordance with one embodiment.
Figure 14B:
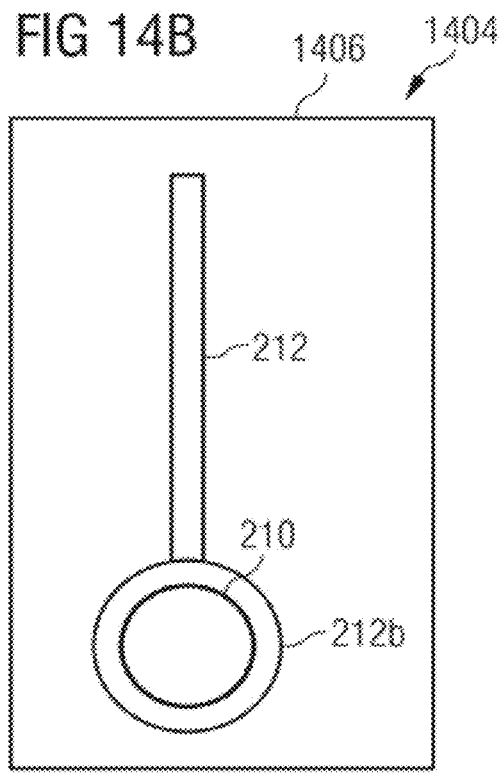

According to an embodiment, the direction of flow of etchant may be provided from a side of the process chamber in a substantially horizontal direction according to an etching device 1402 as shown in an illustration 1400 of FIG. 14A. A workpiece 210 may therefore be placed facing the side of the process chamber from which the flow of etchant is provided such that a side or surface of the workpiece 210 to be etched directly meets the direction of laminar flow of the etchant 206 which may be in a direction from a side of the process chamber in a substantially horizontal direction. A pump 220 may be used to pump an etchant 206 from an overflow tank 224 into process chamber 204 in a substantially horizontal direction from a side of the process chamber as indicated by the arrow 216. In the case of FIG. 14A, the direction of laminar flow of the etchant 206 may be transported in a substantially horizontal direction from the right side of the process chamber to the left side of the process chamber. The workpiece 210 may therefore be placed facing the right side of the process chamber from which the etchant 206 is provided. FIG. 14B shows an illustration 1404 of part of an etching device 1406 which may include a workpiece handler 212 which may further include a workpiece holder 212b for holding the workpiece 210 wherein the workpiece handler may be configured to move the workpiece 210 through the laminar flow of the etchant 106 along a predefined track.

According to an embodiment, the etching device 102 may include a plurality of workpiece handlers 212, each configured to move a workpiece 110 through the laminar flow of the etchant 106 along a predefined track in accordance with the above embodiments.

According to an embodiment the etchant 206 may be configured to be an etchant of copper in a wet copper etch.

According to an embodiment the etchant 206 may be configured to be an etchant of copper, which may include a mixture such as a diluted phosphoric hydrogen peroxide mixture (1 to 5 volume % $H_3PO_4$ and 0.5 to 3% $H_2O_2$); a diluted sulfuric hydrogen peroxide mixture (1 to 5 volume % $H_2SO_4$ and 0.5 to 3 volume % $H_2O_2$); a phosphoric-nitric-acetic acid (45 to 50 weight % phosphoric acid and 1 to 3 weight % nitric acid and 30 to 40 weight % acetic acid).

According to an embodiment the etchant 206 may be configured to be an etchant of copper including at least one of each of the following mixtures: a mixture of 0.5 to 2% $H_2O_2$ and 2 to 4% sulfuric acid; and/or a mixture of 10 to 15% nitric acid and 2 to 6% phosphoric acid; and/or a mixture of 0.5 to 1.5 molar CuCl and 20 to 30% hydrochloric acid; and/or 35% nitric acid.)

According to an embodiment the etchant 206 may be configured to be an etchant of polysilicon in a wet polysilicon etch.

According to an embodiment the etchant 206 may be configured to be an etchant of polysilicon, which may include a mixture such as a nitric acid and hydrofluoric acid mixture ($HNO_3$:HF ratio of between 6:1 and 23:1); tetramethylammonium hydroxide (TMAH) (2 to 10 volume %); choline (2 to 10 volume %).

According to an embodiment the etchant 206 may be configured to be an etchant of silicon in a wet silicon etch.

According to an embodiment the etchant 206 may be configured to be an etchant of silicon which may include a mixture such as a nitric acid and hydrofluoric acid mixture ($HNO_3$:HF ratio of between 6:1 and 23:1); tetramethylammonium hydroxide (TMAH) (2 to 10 volume %); choline (2 to 10 volume %).

According to an embodiment the etchant 206 may be configured to be an etchant of aluminum in a wet aluminum etch.

According to an embodiment the etchant 206 may be configured to be an etchant of aluminum, which may include a phosphoric-nitric-acetic acid (70 to 80 weight % phosphoric acid, 2 to 4 weight % nitric acid, 1 to 5 weight % acetic acid; and/or an etchant including 0.1% to 5% hydrofluoric acid. According to an embodiment the etchant 206 may be configured to be an etchant of glass in a wet etch for glass.

According to an embodiment the etchant 206 may be configured to be an etchant of glass, which may include hydrofluoric acid HF or ammonium fluoride buffered HF for etching borosilicate or boron doped silicate glasses.

According to an embodiment the etchant 206 may be configured to be an etchant of plastic in a wet etch for plastic.

According to an embodiment the etchant 206 may be configured to be an etchant of plastic which may include a solvent, e.g. acetone.

According to an embodiment the etching device may be configured to provide high uniformity performance for electroless metal plating processes.

The basic functionalities of the features described with respect to FIGS. 5, 22 and 23 will be referred to and are applicable throughout all the various embodiments which will be described in more detail below. Identical features as to those described in FIGS. 5, 22 and 23 are denoted with the same reference signs.

Figure 6:
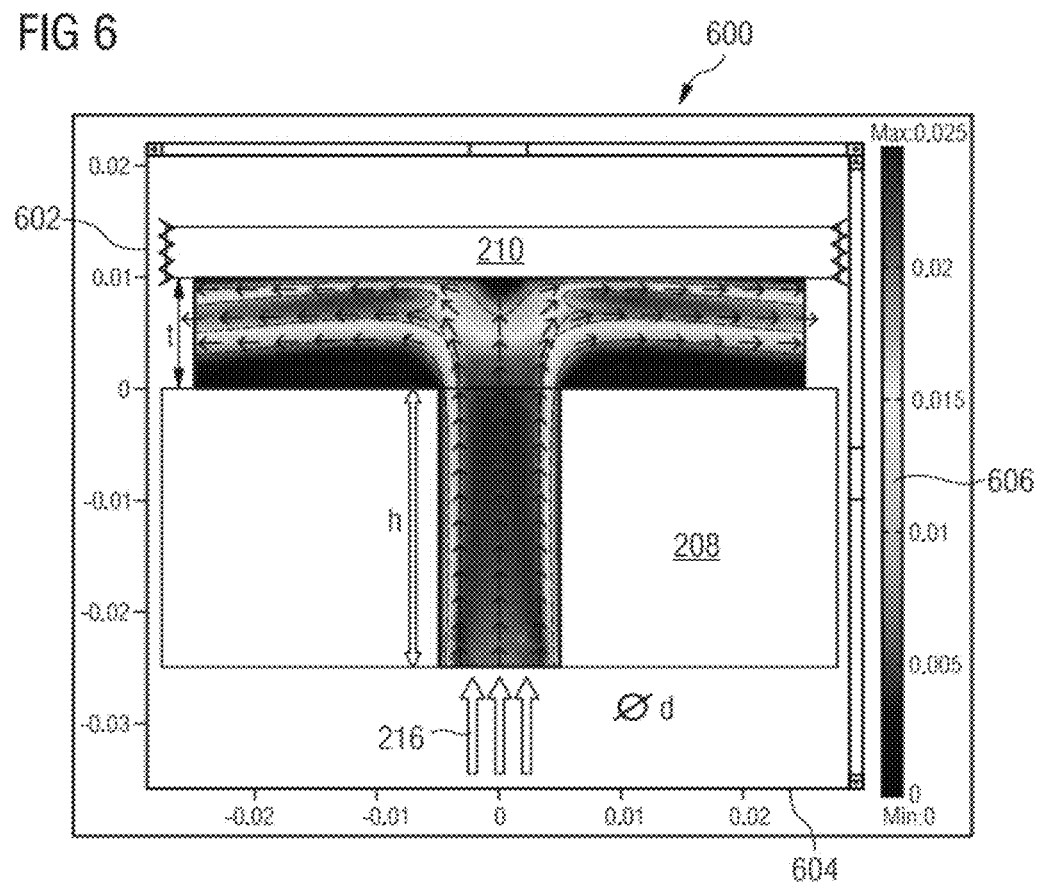
FIG. 6 shows a simulation of flow of etchant in an etching device in accordance with one embodiment.

FIG. 6 shows a simulation 600 of flow of etchant in an etching device in accordance with one embodiment. The simulation 600 shows a simplified static two-dimensional model of an etchant flow having a direction 216 towards a side of a workpiece 210 to be etched. The simulation 600 shows a simplified static two-dimensional model of an etchant flow through a single channel, or a single through-hole of a plurality of through-holes, channels or tubes 508 within a structure 208, such as etchant flow within a region such as that denoted by 410 in FIG. 4. The axes 602 and 604 represent height and width of a channel being simulated, and the scale 606 represents the velocity of etchant flow. The etchant flow may have a direction 216 towards a side of a workpiece 210 to be etched. A structure 208 may be configured to receive a flow of etchant 206, the flow of etchant 206 having a direction 216 entering the structure, (in this case the simulation shows a flow of etchant 206 through a single channel, tube or through-hole 508) and wherein the structure 208 is configured to generate or provide a laminar flow of etchant 206 to a side of the workpiece 210 to be etched. The structure 208 configured to provide a laminar flow of the etchant may have a height, h. In the case of the present simulation 600, h has a value of 25 mm. The height, h, of the structure 208 may have a range of values, e.g. from about 4 mm to about 100 mm, e.g. from about 10 mm to about 80 mm, e.g. from about 15 mm to about 60 mm. The velocity of flow of the etchant 206 in the direction 216 entering the structure 208, or the plurality of channels 508 of the structure in the present simulation 600 may have a velocity of 2 cm/s. The velocity of flow may have a range of values, e.g. from about 0.4 cm/s to about 7 cm/s, e.g. from about 0.4 cm/s to about 5 cm/s, e.g. from about 0.4 cm/s to about 3 cm/s. The diameter of each channel or through-hole 508 in the grating portion of the structure 208, e.g. a collimator grid, may have a diameter, d. In the present simulation 600, d has a value of 10 mm in the present simulation. The diameter, d, of each channel may have a range of values, e.g. from about 0.5 mm to about 10 mm, e.g. from about 1 mm to 8 mm, e.g. from about 1 mm to 3 mm. The distance between the workpiece 210 and the surface of the structure 208 expelling a laminar flow of etchant onto a side of the workpiece 210 to be etched may have a value, t. In the case of the present simulation 600, t has a value of 10 mm. The distance, t, may have a range of values, e.g. from about 0.5 mm to about 60 mm, e.g. from about 1 mm to 40 mm, e.g. from about 1 mm to 20 mm. The combination of the factors of at least: the height, h, of the structure 208 configured to provide a laminar flow of the etchant; the velocity of flow of the etchant 206 entering the structure 208; the diameter, d, of each channel in the grating of structure 208 or collimator grid; and the distance, t, between the workpiece 210 and the surface of the structure 208 expelling a laminar flow of etchant 206 onto a side of workpiece be etched, results in a laminar flow of etchant 206 leaving the structure 208, and arriving at the side of the workpiece 210 to be etched, in a direction substantially perpendicular to the side of the workpiece 210 to be etched. The transport of flow of etchant 206 away from the point of arrival of the laminar flow of etchant on the side of the workpiece 210 to be etched, may be configured to be a flow of etchant 206 in a direction substantially parallel to the side of the workpiece 210 to be etched, away from the surface of the workpiece 210 to be etched.

The structure 208, and the combination of at least one of the following factors the factors: the height, h, of the structure 208 configured to provide a laminar flow of the etchant; the velocity of flow of the etchant 206 entering the structure 208; the diameter, d, of each channel in the grating of structure 208 or collimator grid; and the distance, t, between the workpiece 210 and the surface of the structure 208 expelling a laminar flow of etchant 206 onto a side of the workpiece 210 to be etched, may be configured to create a streamline flow of etchant 206 away from the point of arrival of the laminar flow of etchant on the side of the workpiece 210 to be etched, to minimise turbulence on the side of the workpiece 210 to be etched. The velocity of flow of the etchant 206 leaving the structure 208 and arriving at a side of the workpiece 210 to be etched in the present simulation 600 may have a velocity of 2 cm/s. The velocity of flow may have a range of values, e.g. from about 0.4 cm/s to about 7 cm/s, e.g. from about 0.4 cm/s to about 5 cm/s, e.g. from about 0.4 cm/s to about 3 cm/s. The velocity of flow of the etchant 206 away from the point of arrival of the laminar flow of etchant on the side of the workpiece 210 to be etched may have a velocity of 2 cm/s. The velocity of flow may have a range of values, e.g. from about 0.4 cm/s to about 7 cm/s, e.g. from about 0.4 cm/s to about 5 cm/s, e.g. from about 0.4 cm/s to about 3 cm/s.

According to an embodiment, the etching device 502 may be configured such that the rate of laminar flow of the etchant 206 to a side of the workpiece 210 to be etched is greater than the rate of flow of the etchant due to at least one of diffusion, convection and gravitation to the side of the workpiece 210 to be etched, wherein the forces of diffusion, convection and gravitation refer to the forces acting on etchant molecules which would result in random motion of etchant molecules without a supplementary means, e.g. without a structure 208 and/or workpiece handler 212, or pump for modifying or directing the direction and velocity of etchant flow.

According to an embodiment, the etching device 502 may be configured such that the rate of laminar flow of the etchant 206 to a side of the workpiece 210 to be etched is greater than the highest rate of flow of the etchant due to at least one of diffusion, convection and gravitation to the side of the workpiece 210 to be etched, According to an embodiment, the etching device 502 may be configured such that the rate of laminar flow of the etchant 206 away from the point of arrival of the laminar flow of etchant on the side of the workpiece 210 to be etched is greater than the flow of the etchant due to at least one of diffusion, convection and gravitation to the side of the workpiece 210 to be etched, According to an embodiment, the etching device 502 may be configured such that the rate of laminar flow of the etchant 206 away from the point of arrival of the laminar flow of etchant on the side of the workpiece 210 to be etched is greater than the highest rate of flow of the etchant due to at least one of diffusion, convection and gravitation to the side of the workpiece 210 to be etched.

According to an embodiment, the movement of the workpiece 210 through the laminar flow of the etchant 206 along a predefined track by the workpiece handler 212 may be configured to influence one or more of the following: the rate of laminar flow of the etchant 206 to a side of the workpiece 210 to be etched and/or the rate of laminar flow of the etchant 206 away from the point of arrival of the laminar flow of etchant on the side of the workpiece 210 to be etched.

Figure 7:
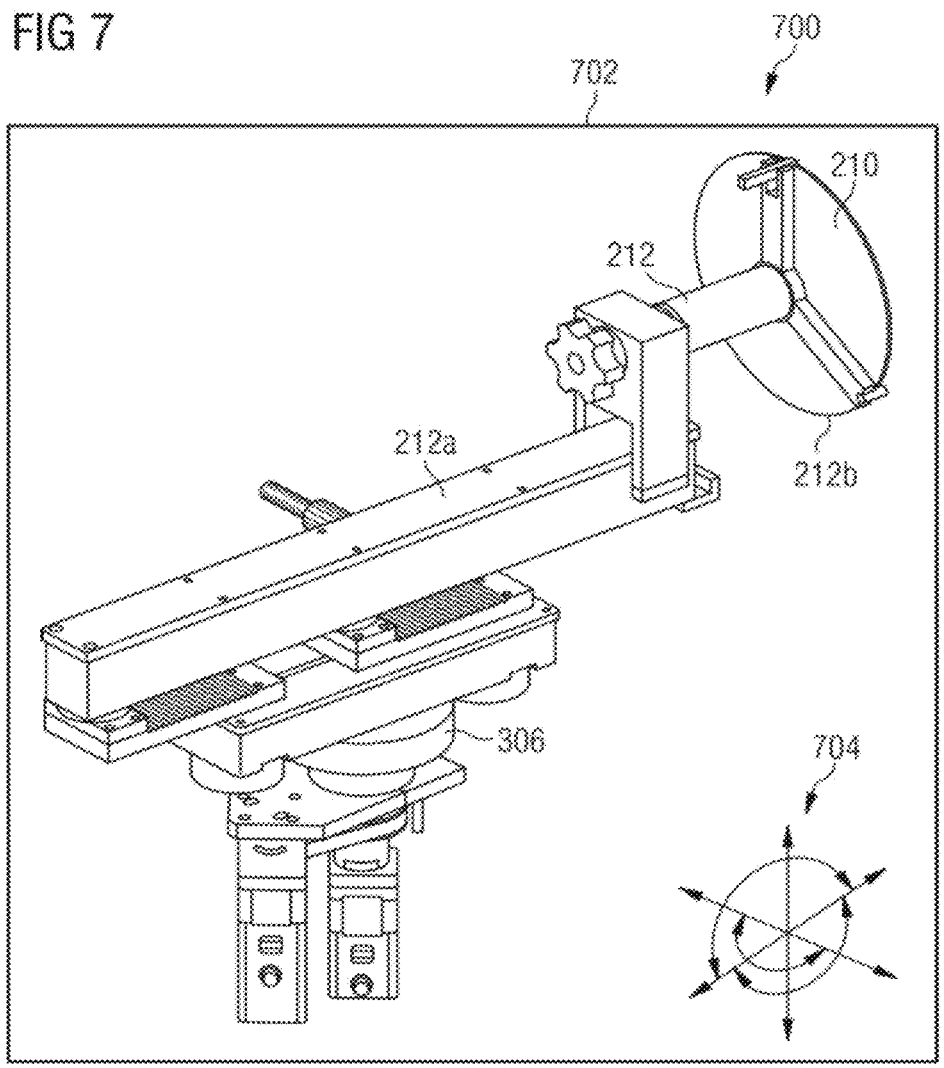
FIG. 7 shows an etching device in accordance with one embodiment.

FIG. 7 shows an illustration 700 of an etching device 702 in accordance with one embodiment. The etching device 702 shows a workpiece handler 212 as described with respect to FIGS. 1 to 6. According to an embodiment, the workpiece handler 212 may be configured to be connected to a multiaxial handling system 306 for manipulating and controlling the motion of a workpiece 210 in at least two directions. The workpiece handler 212 may include an arm portion for gripping or holding the workpiece 210, which fixes the position of the workpiece 210 with respect to the workpiece handler 212. The workpiece handler 212 may further include a workpiece handler supporting portion 212a for connecting to a multiaxial handling system 306 for providing smooth mechanical movement the workpiece with respect to the etchant flow 206, and a workpiece holder portion 212b for gripping a workpiece 210. The multiaxial handling system 306 may be configured to move the workpiece handler 212, 212a on smooth tracks, so that the movement of supporting portion 212a of the workpiece handler with respect to the multiaxial handling system 306 will be smooth. The multiaxial handling system 306 may include a robot arm with e.g. six axes of movement 704.

FIGS. 8A to 8F shows illustrations 800A to 800F of an etching device described above in accordance with the various embodiments of FIGS. 1 to 7

FIG. 8A shows an illustration 800A of a side-view of a portion of an etching device described in accordance with the various embodiments of FIGS. 1 to 7. Illustration 800A shows an etching device including a process chamber 802 and overflow tank 824 arranged coaxially with respect to each other, such that the process chamber 802 forms an inner chamber, and the overflow tank 824 forms an outer chamber. The distance between a top surface of a wall of the overflow tank 824 to a bottom surface of a wall of the overflow tank 824, i.e. the height of the overflow tank 824 may be about 310 mm. The distance between a top surface of a wall of the overflow tank 824 to a bottom surface of a wall of the overflow tank 824, i.e. the height of the overflow tank may have a range of values, e.g. from about 100 mm to about 900 mm, from about 200 mm to about 600 mm, from about 200 mm to about 450 mm.

Figure 8B:
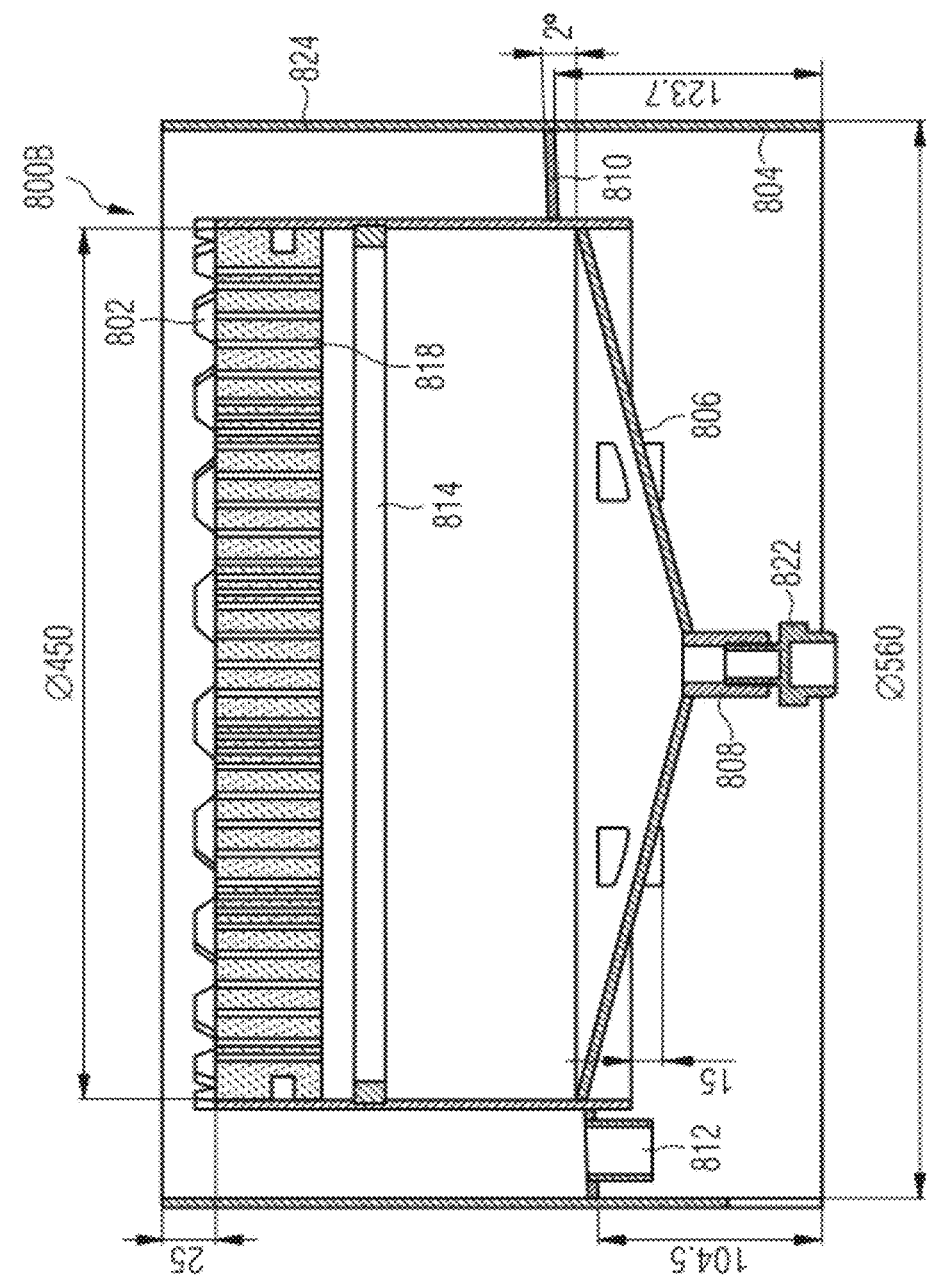

FIG. 8B shows an illustration 800B showing a cross sectional view of a portion of the etching device according to 800A along the plane A-A as shown in illustration 800A. The etching device may include a process chamber 802, an overflow tank 824 and a structure configured to provide a laminar flow of the etchant 818 as already described with respect to earlier embodiments. The etching device may further include a drain pipe 812, and infeed tube 808 for transporting etchant 206 into the process chamber 802, and a welded sleeve 822 as a fitting for the infeed tube 808, a base 806 for supporting and carrying the etching device, a spacer band 810 between the process chamber 802 and overflow tank 824, and a supporting ring 814 which may be used for circulation and for sealing the structure 818 in the process chamber 802. The spacer band 810 also provides a bottom support for the overflow of chemicals of the etchant within the overflow tank 824. No chemicals or etchant chemicals are present in the region below the spacer band 810, that is in the region surrounded by the side walls 804, the spacer band 810 and the base 806. The diameter of the process chamber 802 may have a diameter of 450 mm. The diameter of the process chamber 802 may have a range of values, e.g. from about 200 mm to about 900 mm, from about 300 mm to about 800 mm, from about 400 mm to about 600 mm. The distance between a top surface of a structure configured to provide a laminar flow of the etchant 818 and the top surface of a wall of the overflow tank 824 may be 25 mm. The distance between a top surface of a structure configured to provide a laminar flow of the etchant 818 and the top surface of a wall of the overflow tank 824 may have a range of values, e.g. from about 5 mm to about 100 mm, from about 10 mm to about 80 mm, from about 10 mm to about 50 mm.

FIG. 8C shows an illustration 800C which shows a cross sectional view of a portion of an etching device according to that of to 800A and 800B according to another perspective, wherein the etching device includes at least one holder piece 816 for connecting the structure configured to provide a laminar flow of the etchant 818 to the process chamber 802, and fixing piece 820 for holding the base 806 pieces together and supporting the process chamber 802. Fixing piece 820 may also function as a supporting bracket for a diffuser plate.

FIG. 8D shows an illustration 800D which shows a top view of a portion of an etching device according to that of to 800A, 800B and 800C, wherein the etching device includes a process chamber (inner ring) 802 and overflow tank 824, and wherein the etching device may include a structure 818 configured to provide a laminar flow of the etchant. The drain pipe 812 as described in accordance with illustration 800B may be configured to be connected to a portion of the overflow tank 824 and to be connected to a base 806 of the process chamber 802 as shown in illustration 800C and 800D, in order to feed etchant 206 from the overflow tank 824 into the process chamber 802. A pump may be used to generate a force for feeding the etchant 206 from the overflow tank 824 into the process chamber 802.

FIG. 8E and FIG. 8F show illustrations 800E and 800F show a portion of an etching device according to that of to 800A to 800D wherein the etching device includes a process chamber (inner ring) 802, overflow tank (outer ring) 824, drain pipe 812 and structure 818.

FIGS. 9A to 9F show illustrations 900A to 900F of an etching device described above in accordance with the various embodiments of FIGS. 1 to 8. FIG. 9A shows an illustration 900A of part of a pump dial 906 for connecting to a pump, as described according to feature 220, wherein the pump dial 906 may be connected to a supporting structure 902 wherein the supporting structure 902 may be configured to provide structural support to an etching device according to the embodiments described with respect to FIGS. 1 to 8. The pump as described according to feature 220 may be a piston pressure pump, or an electric rotary pump.

FIG. 9B shows an illustration 900B of parts of a pump dial 906 for connecting to a pump as described according to feature 220, wherein the pump dial 906 may be connected to a supporting structure 902. The pump dial 906 may include the a supporting plate 928 for supporting a pressure regulation monitoring unit, a pressure regulator connected to a pump, a control valve housing bracket 932, and a control valve outlet 940 which may be connected to a the pump by a pressure resistant hose.

FIG. 9C shows an illustration 900C of part of a supporting structure 902 configured to provide stable support to the etching device already described according to various embodiments.

FIG. 9D shows an illustration 900D of an etching device according to that described with respect to FIGS. 1 to 8. According to an embodiment, the etching device may include a filter comprising multiple components 924, 904, 914. The etchant 206 may flow from the overflow tank into the pump. From the pump the etchant may be filtered by the filter 924, 904 and 914 before entering the process chamber. The process chamber 802 or a part of the etching device may be located above a stable supporting structure 902.

FIG. 9E shows and an illustration 900E of an etching device according to that described with respect to 900D. The illustration 900E shows a top view of the chamber with the table top removed. According to an embodiment, the etching device may further comprise a pump 922, e.g. an air compressing, and an outlet valve 926 for providing circulation to a drain.

FIG. 9F shows an illustration 900F of a portion of an etching device according to that of 900A to 900E, wherein the etching device may be configured to be supported by an etching device supporting structure 902, e.g. a stable work bench or table. The etching device may further include a pump supporting plate 916 for supporting or carrying a part of a pump 220 and the outlet valve 926.

FIG. 10 shows an implementation 1000 of an etching device in accordance with one embodiment. The etching device may be modified or configured to be used in the semiconductor industry. The schematics according to FIG. 8 and FIG. 9 may be further configured to include a shield 1010 surrounding the etching device and the support structure such as that of 902. The workpiece handler 212, the multiaxial handling system 306 and the pump 220 may be configured to be controlled by a computer 1012. The etching device may be configured to be used as part of a controlled semiconductor process such that one or more process chambers 1014, 1016 may be included in an integrated processing system as part of an etching process. e.g. a first of the process chambers 1014, 1016 may be a process chamber as described with respect to the various embodiments of FIGS. 1 to 9; and a second of the process chambers 1014, 1016 may be a chamber for rinsing which may be used for rinsing a workpiece 210 immediately after the etching process conducted in the first of the process chambers.

FIG. 11 shows a method 1100 for etching a material of a workpiece in accordance with one embodiment, wherein the method may include the step 1102 of providing a laminar flow of the etchant onto a side of the workpiece 210 to be etched; and the step 1104 of moving the workpiece 210 through the laminar flow of the etchant 206 along a predefined track.

FIG. 12 shows a method 1200 for etching a material of a workpiece in accordance with one embodiment. The method may include a step 1202 of providing a workpiece 210 to a workpiece handler 212; a step 1204 of transferring a workpiece 210 to process chamber 204 for etching; a step 1206 of immersing the workpiece 210 in the process chamber 204, and providing a laminar flow of the etchant onto a side of the workpiece 210 to be etched; steps 1208, 1210 of rotating the workpiece 210 in the process chamber wherein the center of rotation is outside the workpiece 210 and wherein there is no proper motion and/or proper rotation of the workpiece 210 with respect to the workpiece handler 212; a step 1212 of moving the workpiece 210 out of the process chamber; a step 1214 of immersing the workpiece 210 into a rinse chamber; step 1216 of rotating the workpiece in the rinse chamber; a step 1218 of transferring the workpiece 210 to a drier to be dried.

In comparison to conventional methods which may suffice for etching processes wherein the uniformity of etching is not a critical criteria, the embodiments described above provide a solution for obtaining a highly uniform and highly controlled wet etch.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An etching device, comprising:
a process chamber comprising an etchant;
a structure configured to provide a laminar flow of the etchant; and
a workpiece handler configured to hold and move a workpiece through the laminar flow of the etchant along a predefined track, wherein the workpiece handler is configured to hold the workpiece so that a side of the workpiece to be etched is substantially perpendicular to the laminar flow of the etchant, and so that the workpiece is fully immersed in the etchant.

2. The etching device of claim 1,
wherein the predefined track forms at least a part of a loop; and
wherein a center of the loop is located outside the workpiece.

3. The etching device of claim 1,
wherein the process chamber comprises a process tank configured to receive the etchant.

4. The etching device of claim 3,
wherein the etching device is configured to generate a flow of the etchant through the process tank.

5. The etching device of claim 4, further comprising:
at least one pump connected to the process chamber to provide the flow of the etchant through the process tank.

6. The etching device of claim 1,
wherein the laminar flow of the etchant is configured to etch a side of the workpiece.

7. The etching device of claim 6,
wherein the etching device is configured such that the rate of laminar flow of the etchant to a side of the workpiece to be etched is greater than the rate of flow of the etchant, due to at least one of diffusion, convection and gravitation, to the side of the workpiece to be etched.

8. The etching device of claim 1,
wherein the structure comprises a plurality of channels guiding the etchant to thereby provide the laminar flow.

9. The etching device of claim 8,
wherein the channels are formed by an array of pipes being arranged in a predefined manner to provide the laminar flow.

10. The etching device of claim 8,
wherein the structure comprises a plate, the plate comprising a plurality of through-holes as the plurality of channels.

11. The etching device of claim 10,
wherein the plate is at least twice as large as the workpiece.

12. The etching device of claim 1,
wherein the workpiece handler is configured to move the workpiece through the laminar flow of the etchant without proper motion of the workpiece with respect to the workpiece handler.

13. The etching device of claim 12,
wherein the workpiece handler is configured to move the workpiece through the laminar flow of the etchant without proper rotation of the workpiece with respect to the workpiece handler.

14. The etching device of claim 1,
wherein a side of the workpiece to be etched is configured to be at fixed angle with respect to the direction of laminar flow of the etchant.

15. The etching device of claim 1,
wherein the workpiece is a wafer.

16. The etching device of claim 15,
wherein the wafer is a semiconductor wafer.

17. The etching device of claim 15,
wherein the workpiece is a solar cell.

18. The etching device of claim 15,
wherein the workpiece is a printed circuit board.

19. The etching device of claim 1,
wherein the workpiece comprises a structure to be etched.

20. The etching device of claim 19,
wherein the structure to be etched comprises a material which can be etched using a diffusion controlled etching process using the etchant.

21. The etching device of claim 20,
wherein the structure to be etched comprises a material selected from a group consisting of: copper, polysilicon, silicon and aluminum.

* * * * *